United States Patent
Pawashe et al.

(10) Patent No.: US 9,362,074 B2
(45) Date of Patent: Jun. 7, 2016

(54) NANOWIRE-BASED MECHANICAL SWITCHING DEVICE

(71) Applicants: Chytra Pawashe, Beaverton, OR (US); Kevin Lin, Beaverton, OR (US); Anurag Chaudhry, California, CA (US); Raseong Kim, Hillsboro, OR (US); Seiyon Kim, Portland, OR (US); Kelin Kuhn, Aloha, OR (US); Sasikanth Manipatruni, Hillsboro, OR (US); Rafael Rios, Portland, OR (US); Ian A. Young, Portland, OR (US)

(72) Inventors: Chytra Pawashe, Beaverton, OR (US); Kevin Lin, Beaverton, OR (US); Anurag Chaudhry, California, CA (US); Raseong Kim, Hillsboro, OR (US); Seiyon Kim, Portland, OR (US); Kelin Kuhn, Aloha, OR (US); Sasikanth Manipatruni, Hillsboro, OR (US); Rafael Rios, Portland, OR (US); Ian A. Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 60 days.

(21) Appl. No.: 13/996,507

(22) PCT Filed: Mar. 14, 2013

(86) PCT No.: PCT/US2013/031607
§ 371 (c)(1),
(2) Date: Oct. 3, 2013

(87) PCT Pub. No.: WO2014/142910
PCT Pub. Date: Sep. 18, 2014

(65) Prior Publication Data
US 2014/0262707 A1 Sep. 18, 2014

(51) Int. Cl.
*H01H 51/22* (2006.01)
*H01H 59/00* (2006.01)
*B82Y 10/00* (2011.01)
*H01H 1/00* (2006.01)
*H01H 9/02* (2006.01)

(52) U.S. Cl.
CPC ............ *H01H 59/0009* (2013.01); *B82Y 10/00* (2013.01); *H01H 1/0094* (2013.01); *H01H 9/0271* (2013.01)

(58) Field of Classification Search
CPC ............ H01H 59/0009; H01H 1/0094; H01H 9/0271; B82Y 10/00
USPC ............................................ 335/78; 200/181
See application file for complete search history.

(56) References Cited

U.S. PATENT DOCUMENTS 6,127,908 A * 10/2000 Bozler et al. .................. 333/246
6,534,839 B1    3/2003 Frazier et al.
7,215,229 B2 *  5/2007 Shen et al. ...................... 335/78

(Continued)

FOREIGN PATENT DOCUMENTS

KR    1020100029296    3/2010
KR    1020100030735    3/2010

OTHER PUBLICATIONS

International Search Report and Written Opinion from PCT/US2013/031607 mailed Dec. 19, 2013, 10 pgs.

(Continued)

*Primary Examiner* — Bernard Rojas
(74) *Attorney, Agent, or Firm* — Blakely, Sokoloff, Taylor & Zafman LLP

(57) ABSTRACT

Nanowire-based mechanical switching devices are described. For example, a nanowire relay includes a nanowire disposed in a void disposed above a substrate. The nanowire has an anchored portion and a suspended portion. A first gate electrode is disposed adjacent the void, and is spaced apart from the nanowire. A first conductive region is disposed adjacent the first gate electrode and adjacent the void, and is spaced apart from the nanowire.

24 Claims, 24 Drawing Sheets

(56) References Cited

U.S. PATENT DOCUMENTS

| | | | |
|---|---|---|---|
| 7,242,273 B2* | 7/2007 | Isobe et al. | 335/78 |
| 7,609,136 B2* | 10/2009 | Wang et al. | 335/78 |
| 7,821,363 B2* | 10/2010 | Valenzuela et al. | 335/78 |
| 8,604,898 B2* | 12/2013 | Anderson et al. | 335/78 |
| 8,928,435 B2* | 1/2015 | Despont et al. | 335/78 |
| 2002/0153583 A1* | 10/2002 | Frazier et al. | 257/448 |
| 2005/0057329 A1* | 3/2005 | Shen et al. | 335/78 |
| 2005/0181587 A1* | 8/2005 | Duan | B82Y 10/00 438/551 |
| 2006/0139842 A1* | 6/2006 | Shim et al. | 361/160 |
| 2006/0274470 A1 | 12/2006 | Srinivasan et al. | |
| 2008/0169707 A1 | 7/2008 | Wright et al. | |
| 2009/0242405 A1* | 10/2009 | Mayer | B81C 1/00214 204/435 |
| 2009/0243772 A1* | 10/2009 | Bilhaut et al. | 335/208 |
| 2010/0140066 A1* | 6/2010 | Feng et al. | 200/181 |
| 2010/0252403 A1* | 10/2010 | Hays et al. | 200/181 |
| 2011/0036690 A1* | 2/2011 | Wang et al. | 200/181 |
| 2011/0317325 A1* | 12/2011 | Espinosa et al. | 361/211 |
| 2014/0008604 A1* | 1/2014 | Wu | H01L 21/3083 257/9 |

OTHER PUBLICATIONS

Jang, Min-Woo Janglow Mass MEMS/NEMS Switch for a Substitute of CMOS Transistor Using Single-Walled Carbon Nanotube Thin Film, A Dissertation Submitted to the Faculty of the Graduate School of the University of Minnesota, Jul. 2011, 222 pgs.

Jha, C.M., et al., CMOS-Compatible Dual-Resonator MEMS Temperature Sensor With Milli-Degree Accuracy, Departments of Mechanical and Electrical Engineering, Stanford University, Transducers & EUROSENSORS ' 07, The 14th International Conference on Solid-State Sensors, Actuators and Microsystems, Lyon, France, Jun. 10-14, 2007.

Henry, Michael B., et al., From Transistors to MEMS: Throughput-Aware Power Gating in CMOS Circuits; Department of Electrical and Computer Engineering Virginia Tech, Blacksburg, Virginia, EDAA, 2010 6 pgs.

Leong, V.X.H., et al., Vertical Silicon Nano-Pillar for Non-Volatile Memory, Transducers' 11, Beijing, China, Jun. 5-9, 2011, 4 pgs.

Akarvardar, Kerem, et al., Ultralow Voltage Crossbar Nonvolatile Memory Based on Energy-Reversible NEM Switches; IEEE Electron Device Letters, vol. 30, No. 6, Jun. 2009, 3 pgs.

Bartsch, Sebastian T., A single active nanoelectromechanical tuning fork front-end radio-frequency receiver, Nanotechnology 23, May 10, 2012, 8 pgs.

Napoli, Mariateresa, et al., Characterization of Electrostatically Coupled Microantilevers, Journal of Microelectromethanical Systems, vol. 14, No. 2, Apr. 2005, 10 pgs.

Oilier, et al., Ultra-Scaled High-Frequency Single-Crystal Si NEMS Resonators and Their Front-End Co-Integration With CMOS for High Sensitivity Applications, MEMS 2012, Paris, France, Jan. 29-Feb. 2, 2012, 4 pgs.

Loh, Owen, et al., Robust Carbon-Nanotube-Based Nano-electromechanical Devices: Understanding and Eliminating Prevalent Failure Modes Using Alternative Electrode Materials, Small 2011, 7, No. 1, pp. 79-86.

Feng, X.L., Low Voltage Nanoelectromechanical Switches Based on Silicon Carbide Nanowires, Nano Letters 2010, 10, pp. 2891-2896.

Chong, Soogine, et al., Integration of Nanoelectromechanical (NEM) Relays with Silicon CMOS with Functional CMOS-NEM Circuit, Department of Electrical Engineering, Stanford University, IEEE, 4 pgs.

Jeon, Jaeseok, et al., Seesaw,Relay Logic and Memory Circuits, JMEMS Letters, Journal of Microelectromechanical Systems, vol. 19, No. 4, Aug. 2010, 3 pgs.

Spencer, Matthew, et al., Demonstration of Integrated Micro-Electro-Mechanical Relay Circuits for VLSI Applications, IEEE Journal of Solid-State Circuits, vol. 46, No. 1, Jan. 2011, pp. 308-320.

International Preliminary Report on Patentability from PCT/US2013/031607 mailed Sep. 24, 2015, 7 pgs.

* cited by examiner

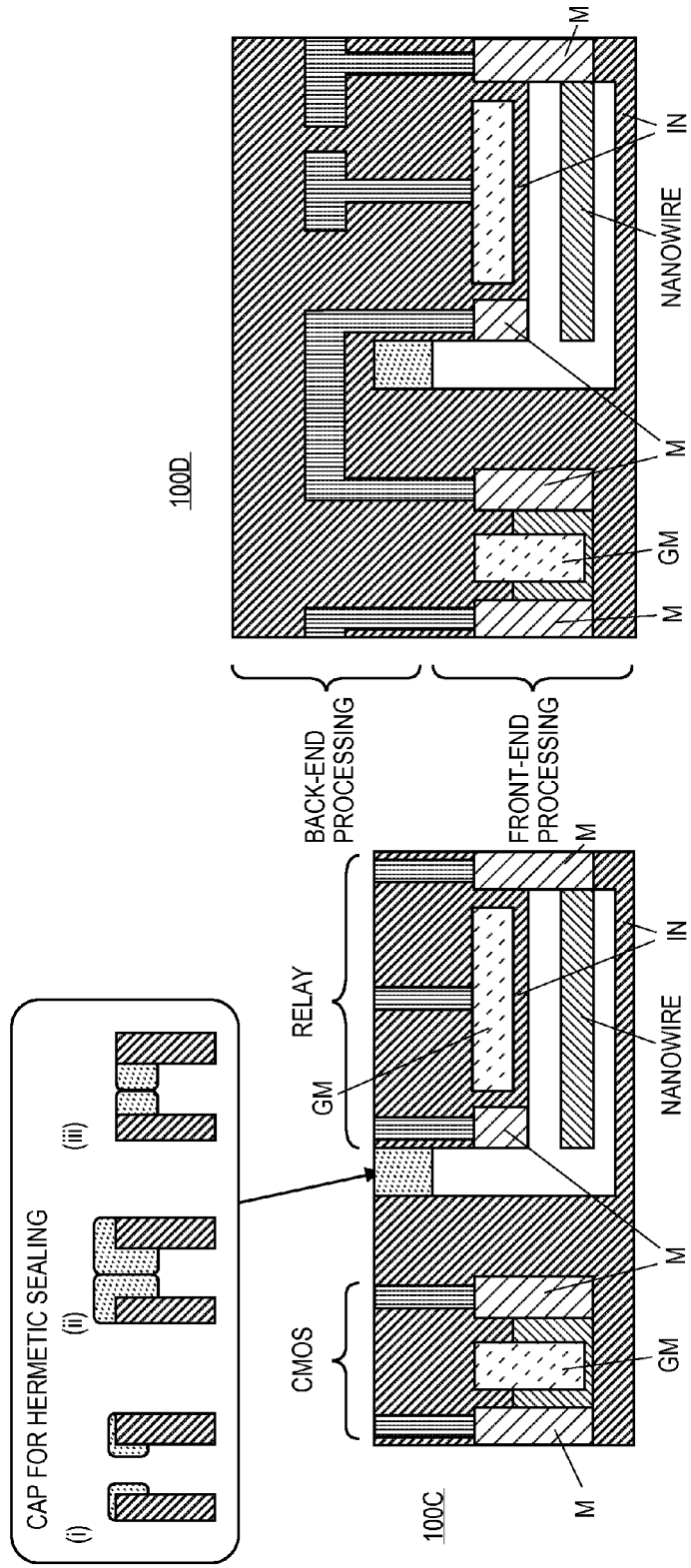

NANOWIRE-BASED MECHANICAL SWITCHING DEVICE

CLAIM OF PRIORITY

This application is a U.S. National Phase application under 35 U.S.C. §371 of International Application No. PCT/US2013/031607, filed Mar. 14, 2013, entitled "NANOWIRE-BASED MECHANICAL SWITCHING DEVICE," the entire contents of which are incorporated herein by reference.

TECHNICAL FIELD

Embodiments of the invention are in the field of semiconductor device processing and, in particular, nanowire-based mechanical switching devices.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables a thin packaging profile and low overall warpage compatible with subsequent assembly processing.

Furthermore, for the past several years, microelectromechanical systems (MEMS) structures have been playing an increasingly important role in consumer products. For example, MEMS devices, such as sensors and actuators, can be found in products ranging from inertial sensors for air-bag triggers in vehicles to micro-mirrors for displays in the visual arts industry and, more recently, in mobile applications such as air pressure sensors for altitude sensing. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictates that the processes used to fabricate such MEMS devices need to be extremely sophisticated.

However, significant improvements are still needed in the area of MEMS (and smaller) device fabrication and operation.

DESCRIPTION OF THE EMBODIMENTS

Figure 1A:
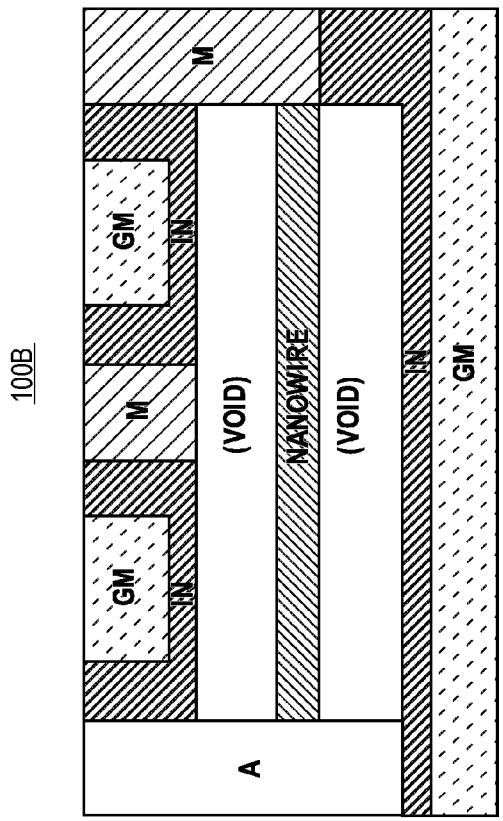
FIG. 1 illustrates plan views of (a) a nanowire relay anchored on one side and (b) a nanowire relay anchored on both sides, and cross-section views of (c) a first fabrication stage of a nanowire relay anchored on one side and (d) a second fabrication stage of a nanowire relay anchored on one side, in accordance with an embodiment of the present invention.

Nanowire-based mechanical switching devices are described. In the following description, numerous specific details are set forth, such as specific operational modes of MEMS or nano-electromechanical systems, in order to provide a thorough understanding of embodiments of the present invention. It will be apparent to one skilled in the art that embodiments of the present invention may be practiced without these specific details. In other instances, well-known features, such as integration processing fabrication flows, are not described in detail in order to not unnecessarily obscure embodiments of the present invention. Furthermore, it is to be understood that the various embodiments shown in the Figures are illustrative representations and are not necessarily drawn to scale.

One or embodiments of the present invention are directed to a nanowire-based mechanical switching device. Applications include, but are not limited to, micro/nano-electromechanical systems, non-volatile memory devices, radio frequency oscillators, relays, and switching devices.

To provide context, electrostatically actuated mechanical devices, and relays in particular, have been scaled down to several hundreds of nanometers using modern nano-fabrication technologies. In contrast to prior approaches, embodiments of the present invention may differs from relays demonstrated in previous research by one or more of (1) relays described herein are fabricated using a nanowire fabrication process, (2) relays described herein are compatible with front-end CMOS processing, or (3) relays described herein are fabricated using a capping and passivation process that allows for continued back-end processing after relay fabrication. Additionally, unique types of devices and applications are described herein.

In general, one or embodiments of the present invention are directed to a nano-mechanical structure (e.g., a free-standing nanowire) that can be moved by electrostatic forces, and may be brought into and out of contact with a conductive surface. The structure may be fabricated using same silicon layers used for CMOS transistors channel fabrication, allowing for monolithic integration. Such nano-mechanical structure or devices can facilitate applications including relays (e.g., mechanical on-off switches), non-volatile memory (NVM) devices, and oscillators, in a manner that is high-volume manufacturable with current CMOS processes. General advantages of mechanical devices over similar CMOS devices may include, but are not limited to, significantly lower energy loss due to switching the state of the device, and virtually zero leakage in the device's off-state. Advantages of mechanical devices that are monolithically integrable with CMOS as described herein may include, but are not limited to, the use of established high-volume CMOS manufacturing to fabricate nano-mechanical devices in large arrays with small geometries, and hybrid CMOS/mechanical devices can be constructed, which can may provide energy consumption advantages. Compared to previous work on mechanical relays, devices described herein may have advantages such as, but not limited to, compatibility with semiconductor front-end integration, device fabrication from a Si or SiGe nanowire process which allows for seamless integration with CMOS devices. Regarding scalability, as devices approach the nanometer-size regime, adhesion forces become significant and limit the scaling of actuation voltage. Using a semiconductor material as described herein, adhesion forces which are present in metal-metal junctions are minimized. One or more embodiments include an electron tunneling device and a "collapsed mode" relay which mitigate the adhesion forces in the design. Applications may include, but are not limited to, unique relay-based solutions that can be used for non-volatile memory, oscillators for circuit applications, and hybrid CMOS-mechanical transistors. Additionally, in one or more embodiments, relay topologies for complimentary logic gates are described.

More specifically, in an embodiment, a nanorelay structure described herein may be applicable for, but not limited to, CMOS power-gating, non-volatile memory, and oscillators. Advantages of the nanorelay device for each application is detailed individually in greater detail below.

Regarding the application of a nanorelay structure for non-volatile memory, in an embodiment, non-volatility is achieved by encoding the memory as the position of the mechanical element, and taking advantage of interfacial adhesion and work function difference between surfaces, which can hold memory states without sustained energy input. Approaches to achieving practical non-volatile memory include, in one or more embodiments, fine-grain integration with CMOS reading and writing circuitry, the manufacture large arrays of the memory devices, security advantages for such mechanical memory devices versus electrical-based memory devices, such as flash or fuses. For example, as opposed to fuse-type memories, the mechanical memory device can be reprogrammed (however, it can be made to be non-reprogrammable).

Regarding the application of a nanorelay structure for power-gating CMOS circuits, in an embodiment, mechanical switches can utilize lower power utilization, especially in low-throughput applications. In one such embodiment, nano-mechanical switches are utilized as power gating devices to CMOS circuits, which can be integrated with the CMOS at a fine-grain level, and lead to improved energy efficiency. Furthermore, in accordance with one embodiment, a self-gating transistor is described herein, that is a CMOS-mechanical hybrid transistor which physically disconnects the source from the drain (suppressing off-state leakage) automatically. The device automatically "sleeps" when it is not being utilized, allowing for fine-grain power gating without sacrificing device area, and removing the complexity of deciding when to gate power.

Regarding the application of a nanorelay structure for oscillators, in an embodiment, in addition to static switching operations, nano-mechanical structures can show resonating behaviors with AC inputs, which could be used for RF filters and oscillators for mobile and SoC applications. When an AC voltage is applied across a capacitor, e.g., a nanowire and electrodes separated by an air gap, an AC current is inherently induced due to the time-varying voltage. At the resonant frequency of the nanowire, the AC current may show a large enhancement from the mechanical resonance of the wire, which results in time-varying capacitance and an additional source of AC current. Advantages of the CMOS-compatible nano-mechanical oscillators may include, but are not limited to, on-chip, monolithic RF components with front end integration, and enabling optimization of frequency ranges by adjusting DC biasing conditions as well as device structures enabling electrically tunable resonator center frequencies. Additionally, devices can be fabricated in large arrays to enhance output signal and improve phase noise and channel selectivity. Other applications include, in the case of resonators, sensing for on-die temperatures. In such cases, temperature changes cause the resonance frequency of the device to shift, which can be measured. A relay-based temperature sensor is advantageous over current temperature sensors on the chip because such a device can be fabricated to be much smaller.

As described in association with FIG. 1 below, in an embodiment, a nano-mechanical device is fabricated on a silicon wafer. The device includes a nanowire that is coupled (attached) to material on one or both ends, and suspended in a void. The void may be vacuum, filled with a gas, or filled with a liquid. One or both ends of the nanowire is be connected to a solid material, which is its anchor point. Thus, a single anchor nanowire or a double anchor nanowire may be fabricated. The anchors may be composed of a conductive material, creating an electrical path to the nanowire. The anchors may also have multiple nanowires coupled thereto.

Figure 1B:
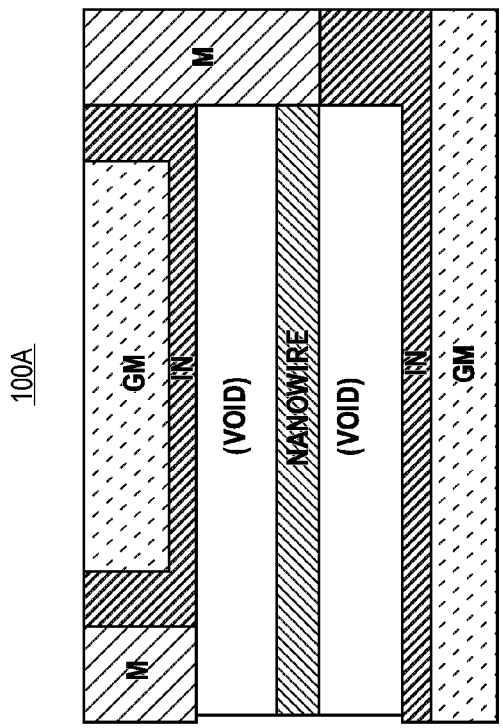

FIG. 1 illustrates plan views of (a) a nanowire relay 100A anchored on one side and (b) a nanowire relay 100B anchored on both sides, and cross-section views of (c) a first fabrication stage 100C of a nanowire relay anchored on one side and (d) a second fabrication stage 100D of a nanowire relay anchored on one side, in accordance with an embodiment of the present invention. Referring to FIG. 1, regions labeled "IN" are insulators. Regions labeled "M" are metal or semiconductors. Regions labeled "GM" are metals or semiconductors with an insulator layer between the insulator layer and the nanowire. The region labeled "A" is an anchor material, and may be a conductive or insulating material. The "void" region does not contain a solid material, but may contain a gas, liquid, or be vacuum. The device may be oriented, with respect to an underlying substrate, parallel or orthogonal to the page. In part (c) of FIG. 1, a nanowire relay is shown as fabricated adjacent to CMOS transistors with a seal subsequently formed (e.g., an exemplary process is depicted for hermetic sealing by cap formation). In one such embodiment, then, the sealing may be a capping process, where an insulating material or a metal is deposited with poor directionality. The metal fills the port, and is then planarized with CMP. Further back end of line processing, such as interconnect formation, may then be performed, as depicted in (d) of FIG. 1, e.g., by standard back-end CMOS processing. It is to be understood that it may not be necessary that the gate be insulated if the geometry is chosen such that the relay does not short to the gate (e.g., for an oscillator, or a relay with mechanical stops). Alternatively, instead of having insulation on the gate electrode, the insulation can also be on the nanowire. And, it may be the case that no insulation is necessary if the geometries are selected such that the relay is not contacting the gate in the "on" position.

Referring again to FIG. 1, in an embodiment, the nanowire is composed of a semiconductor material, or a composite of semiconductor, metal, and/or insulator. The semiconductor material may be shared with conventional MOS transistors in other areas of an underlying wafer. In one embodiment, the walls of the void in which the nanowire is encased can be divided into different functional regions. The regions may include a metal or semiconductor (e.g., optionally with an insulation layer between the metal or semiconductor and the nanowire), or an insulator. Additionally, in one embodiment, the walls of the void form a rectangular box and the functional regions are disposed on any available side of the box. It is to be understood that the selection and wiring of the above described regions can provide a functional device, such as a logic switch, power switch, or memory device, as described in greater detail below.

In an embodiment, referring again to FIG. 1, in order to create the void, a release etch is typically performed for such nano-mechanical devices, where a previously deposited sacrificial material is etched. Since the nanowire can be single crystalline, a compatible process is used to the nanowire material, such as an epitaxial growth process. Here, nanowire fabrication known in the art for CMOS transistors can be extended to fabricate nanowire-based nano-mechanical devices, and offer a processing path to become integrable with those transistors for high-volume manufacturing. This approach provides a unique feature of the devices described in one or more embodiments of the present invention, where fine-grain mixing of mechanical and CMOS devices can be achieved. In an embodiment, following fabrication of the relays, the structure is passivated such that the air gap is sealed, as described in association with part (c) of FIG. 1. Subsequent to such passivation, fabrication of interconnects is continued using standard back-end CMOS processing, as described in association with part (d) of FIG. 1.

Overall, in accordance with one or more embodiments of the present invention, eleven exemplary nano-mechanical devices are described in greater detail below. The devices include a mechanical logic switch, a basic logic switch optimizing contact electrode and gate geometry, a mechanical logic switch with non-linear springs, a devices for complimentary logic, a catch and release relay, a hybrid MOS-relay transistor with disconnecting source, a power gating relay, a non-volatile memory device, a electron tunneling relay, a mechanical resonating oscillator, and a current modulation through piezoresistive properties of silicon.

Figure 2:
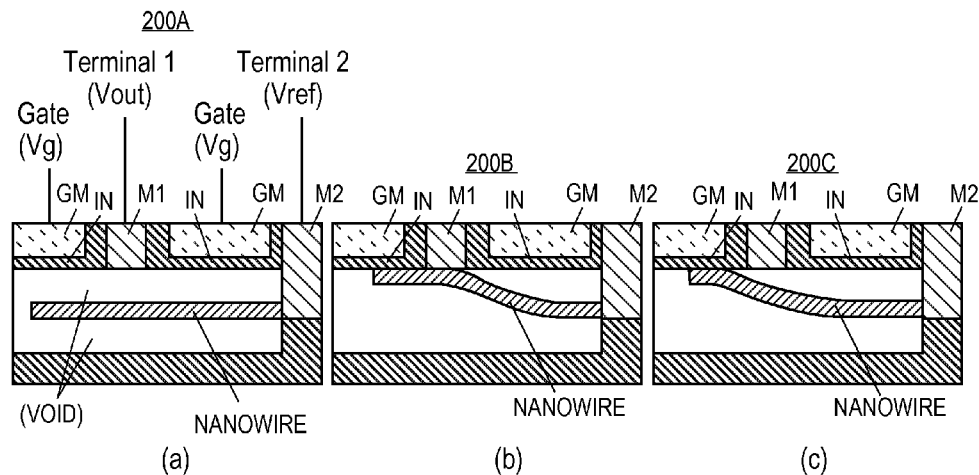
FIG. 2 illustrates plan views of (a) a nanowire relay switch in the initial off position, (b) the relay in the on position, and (c) the relay in an alternate off position, in accordance with an embodiment of the present invention.

In a first aspect, in accordance with an embodiment of the present invention, a mechanical logic switch is described below in association with FIG. 2, which illustrates plan views of (a) a nanowire relay switch 200A in the initial off position, (b) the relay in the on position 200B, and (c) the relay in an alternate off position 200C. Referring to FIG. 2, the region GM corresponds to the gate, with voltage Vg, and has an electrical insulation layer coating the gate. The region M1 corresponds to the output terminal, with voltage Vout. The region M2 corresponds to the reference voltage, Vref, which is electrically connected to the nanowire. In the on position, M1 and M2 have an electrical connection.

To switch the relay from the off position (FIG. 2(a) or FIG. 2(c)) to the on position (FIG. 2(b)), Vg is set such that the absolute difference between Vg and Vref is greater than some threshold voltage. An electrostatic force is induced between the nanowire and GM, causing the nanowire to move towards it and M1. The nanowire contacts M1, creating an electrical path between it and M2, causing Vout to go to Vref. This is the on state for the switch. GM and the nanowire do not have an electrical path due to an insulation layer.

To switch the relay from the on position (FIG. 2(b)) to the off position (FIG. 2(a) or FIG. 2(c)), Vg is set such that the absolute difference between Vg and Vref is below some threshold voltage. The electrostatic force between GM and the nanowire is reduced, causing the nanowire to move away from M1 and disconnecting it from M2. This is the off state for the switch. Depending on Vg and the adhesion properties of the insulator the nanowire contacts, the nanowire can return to the off state in either FIG. 2(a) or FIG. 2(c).

In an embodiment, advantages of the device of FIG. 2, as compared to a CMOS transistor as a switch, include that the nanowire relay has lower switching energy, virtually no leakage current through source and drain terminals in the off state, and a near vertical current-voltage relation when switching. Compared to other prior mechanical switches, the nanowire relay can be fabricated monolithically with CMOS transistors, is smaller, and switches faster due to being smaller. Another advantage over prior works is the possibility to operate in a "collapsed" mode, which is the alternate off state shown in FIG. 2(c). This state is achieved by controlling the adhesive properties of the nanowire interface, and is advantageous because the switching time is reduced between the off to on state, improving transient performance of the switch.

Figure 3:
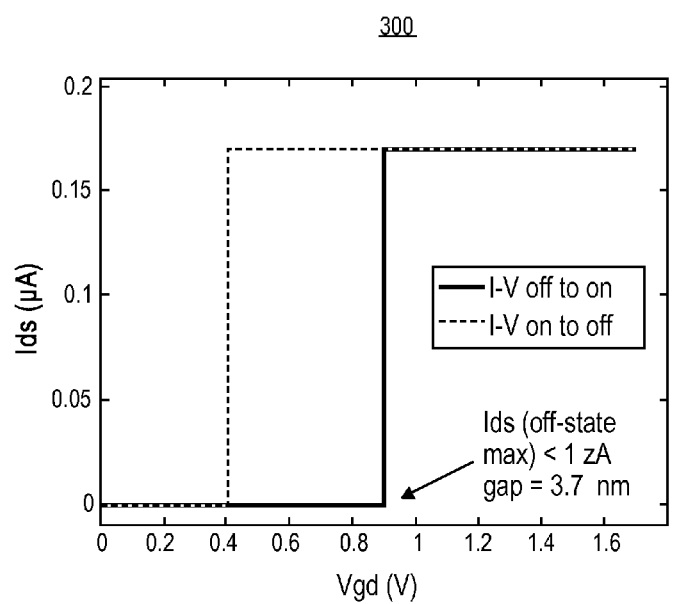
FIG. 3 is a plot of a simulation of an I-V relationship for a mechanical logic or power switch making source-drain contact with an area of 1 $nm^2$, in accordance with an embodiment of the present invention.
Figure 4:
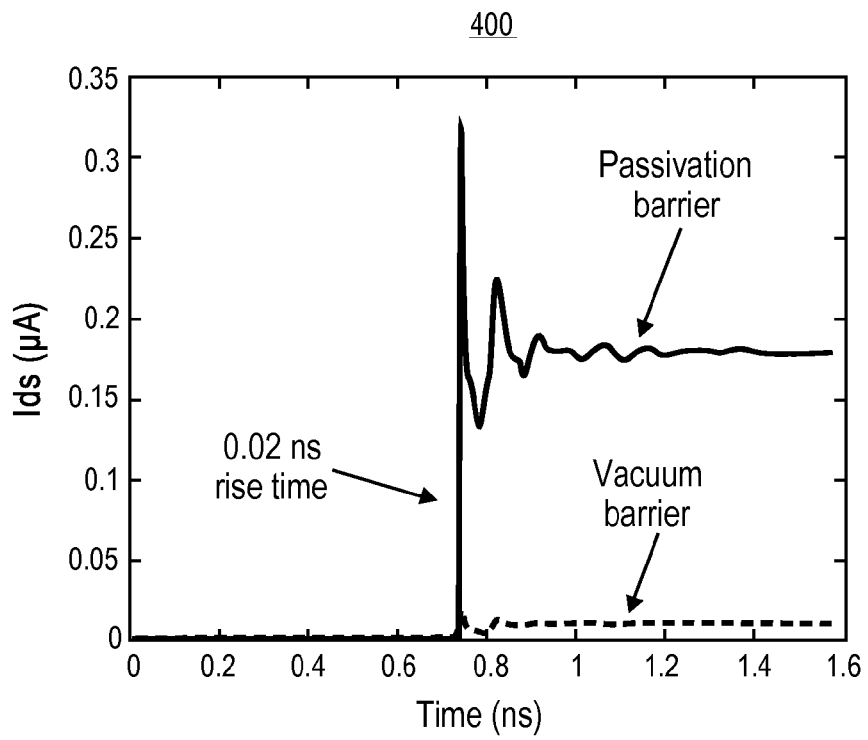
FIG. 4 is a plot demonstrating transient behavior of a nanomechanical switch changing from its off-state to its on-state, with gate voltage applied at time=0, in accordance with an embodiment of the present invention.
Figure 5:
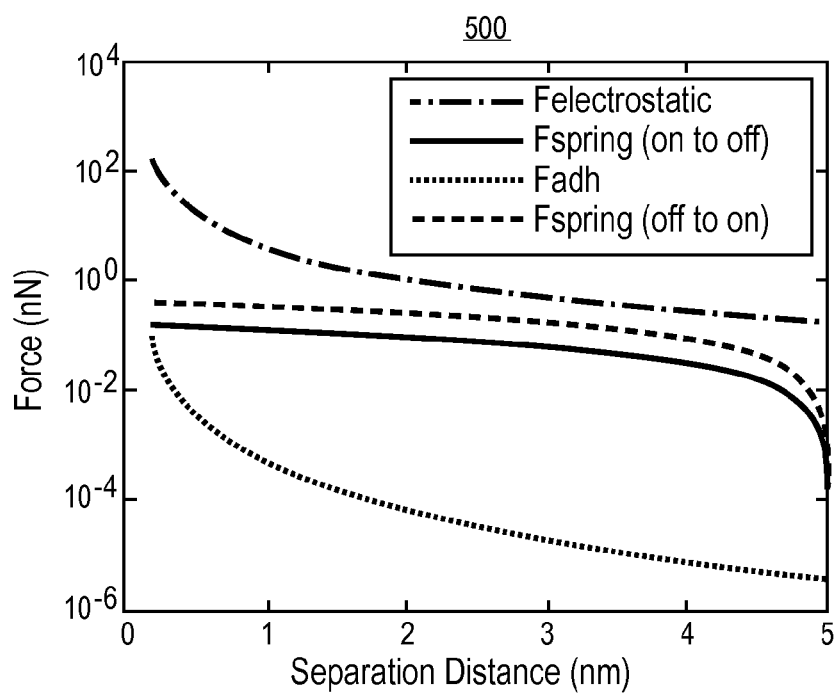
FIG. 5 is a plot demonstrating force relations versus separation distance of a 1 $nm^2$ contact point in a mechanical switch, in accordance with an embodiment of the present invention.

Numerical simulations have been developed to test the operation of the nano-mechanical device, which indicate the feasibility of the device of FIG. 2. The nanowire simulated is 100 nm long, 10 nm wide, 5 nm thick, with 100 GPa elastic modulus, 5 nm off-state gap distance, 10 zJ Hamaker constant, and real contact area of 1 nm2. FIG. 3 described below shows the I-V relationship when switching on and off. FIG. 4, also described below, shows the transient response of the switch when switching from its off to on state. The current values were determined using the WKB approximation for quantum tunneling, and utilizing a dynamic multi-physics finite element analysis of the nanowire moving towards a source electrode, giving the position of the nanowire with respect to the source conductor. FIG. 5, described below, shows the force relations as a function of gap separation distances, showing the spring forces in the wire (taken from basic beam theory), electrostatic pull-in force (approximated as a set of parallel plate capacitors), and interfacial adhesion force (computed using Hamaker theory).

FIG. 3 is a plot 300 of a simulation of an I-V relationship for a mechanical logic or power switch making source-drain contact with an area of 1 nm2, in accordance with an embodiment of the present invention. Plot 300 reveals virtually infinite slope and negligible off-state current, which are improvements over CMOS switches. In reference to FIG. 2, Ids corresponds to the current between M1 and M2, and Vgd is the voltage difference between GM and M2. Hysteresis exists due to a r-2 dependence of the electrostatic force, as well as contact adhesion. The current transfer in this case is due to tunneling, and a 0.44 nm, 1 eV barrier is taken due to passivation of the atoms in contact.

FIG. 4 is a plot 400 demonstrating transient behavior of a nano-mechanical switch changing from its off-state to its on-state, with gate voltage applied at time=0, in accordance with an embodiment of the present invention. Referring to plot 400, tunneling currents for two different barriers across a 1 nm2 contact interface are shown. Minimum distance between source and drain is about 0.44 nm, corresponding to the maximum Ids. Vds=1 V in this plot. Fluctuations in current are due to small variations in overall contacting area and separation distance as the relay switches, which is a function of mechanical position.

FIG. 5 is a plot 500 demonstrating force relations versus separation distance of a 1 nm2 contact point in a mechanical switch, in accordance with an embodiment of the present invention. Plot 500 shows the electrostatic force applied by a gate (Felectrostatic), the effective spring force of the beam (Fspring) from its off to on, and on to off states, and the force of contact adhesion (Fadh). The corresponding switch is operational because the electrostatic force is greater than the spring force, allowing for pull-in to occur. Additionally, the on to off spring force is greater than the adhesion force, allowing pull-out to occur. Operating voltage is 1 V. If "collapsed" operation is utilized, as in FIG. 2(c), then the on to off spring force can be lower than the adhesion force at contact, allowing for lower voltage operation.

Figure 6:
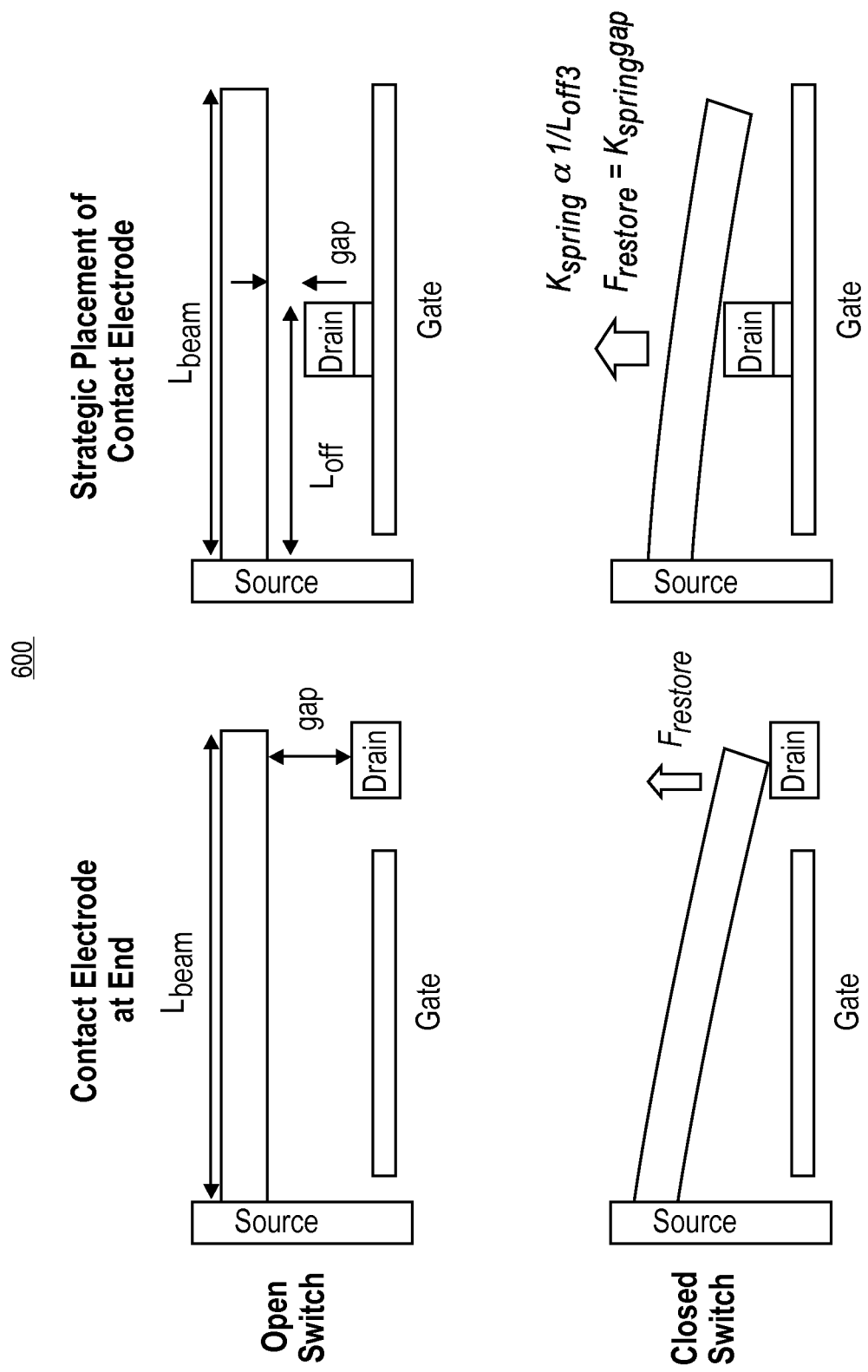
FIG. 6 is a schematic illustrating open and closed positions for a relay with contact electrode placed at the end, as compared to a relay with the contact electrode placed closer to the clamped edge to improve spring restoring force, in accordance with an embodiment of the present invention.

In a second aspect, in accordance with another embodiment of the present invention, a mechanical logic switch with optimized contact electrode and gate geometry is described. FIG. 6 is a schematic 600 illustrating open and closed positions for a relay with contact electrode placed at the end, as compared to a relay with the contact electrode placed closer to the clamped edge to improve spring restoring force, in accordance with an embodiment of the present invention.

Referring to FIG. 6, a relay structure has a gate electrode and a contact electrode. The gate electrode mechanically actuates the cantilever such that the cantilever contacts the contact electrode and current conducts through the source and drain. A sufficiently high spring restoring force allows the relay to overcome adhesion and return to its disconnected off state. The contact electrode may be strategically placed to maximize the spring restoring force. The spring restoring force is determined by finding the mechanical spring constant of the cantilever, and the distance the cantilever is deflected from its neutral position. A value for mechanical spring constant is proportional to the cube of the effective length, so shortening the effective length increases the spring constant dramatically. To shorten the effective length of the cantilever, in an embodiment, the contact electrode is not be placed at the end of the cantilever. This approach has an additional benefit of allocating space for the gate electrode to be placed further from the clamped end of the cantilever, increasing the effectiveness of the electrostatic actuation force and lowering the actuation voltage.

Figure 7:
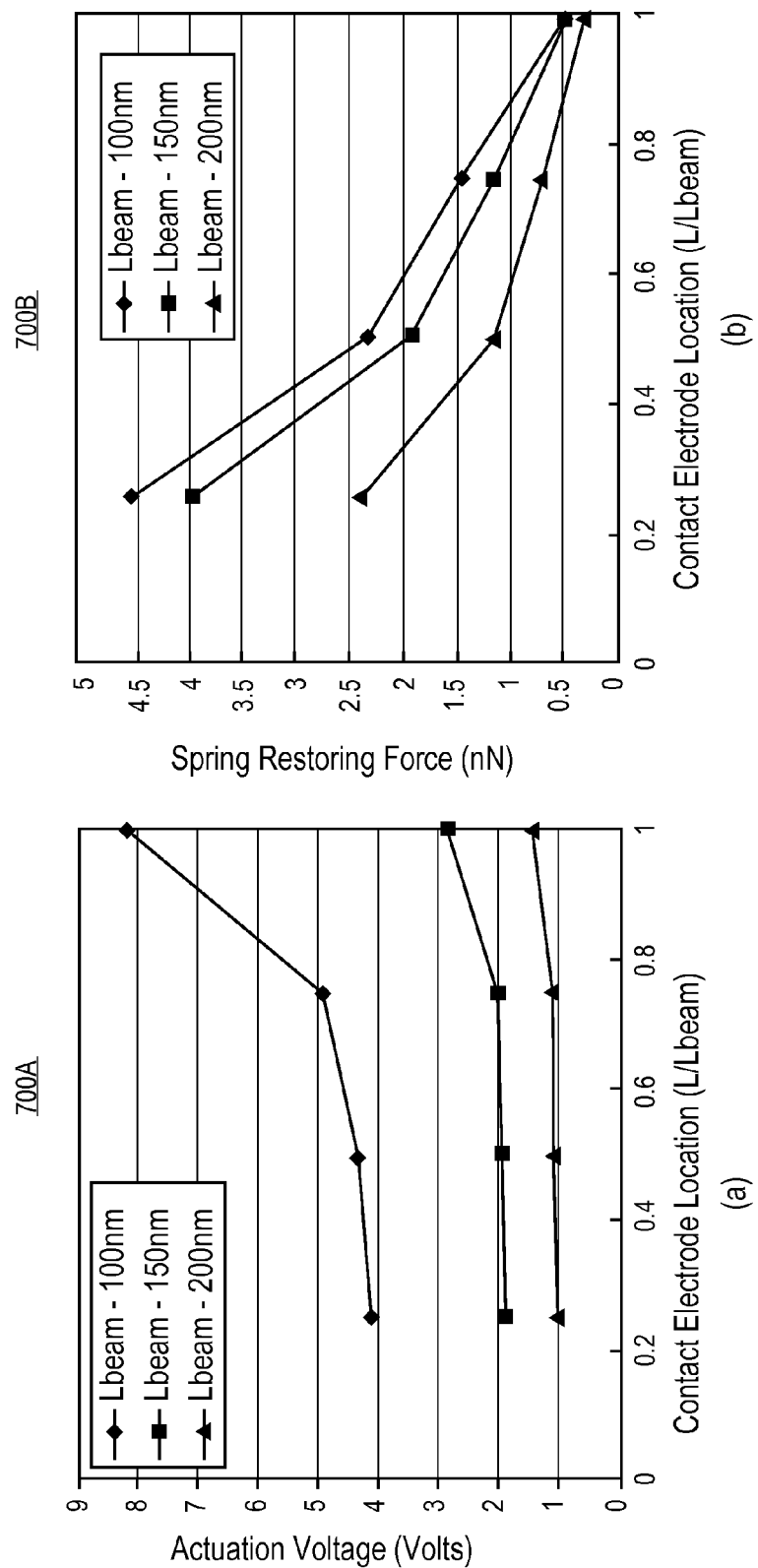
FIG. 7 includes (a) a plot of actuation voltage versus contact electrode location and (b) a plot of spring restoring force versus contact electrode location, in accordance with an embodiment of the present invention.

In an embodiment, by optimizing the contact electrode location, the cantilever can be designed to be more compliant, while maintaining the same spring restoring force to overcome adhesion forces. In doing so, it is possible to actuate the relay using a lower operational voltage. FIG. 7 includes (a) a plot 700A of actuation voltage versus contact electrode location and (b) a plot 700B of spring restoring force versus contact electrode location, in accordance with an embodiment of the present invention. Referring to FIG. 7, strategic placement of contact electrode position reduces actuation voltage and increases spring restoring force. In an embodiment, a similar optimization scheme is used to for double-clamped relays.

In a third aspect, in accordance with another embodiment of the present invention, a mechanical logic switch with non-linear springs is described. As an example, FIG. 8 includes a schematic 800 of nonlinear beam with mechanical stop, and a corresponding plot 802 demonstrating an improvement of spring restoring force without an increase in actuation voltage, in accordance with an embodiment of the present invention. In other embodiments, the concept of non-linear springs can be extended to devices other than mechanical logic switches (e.g., memory devices, power switches).

Figure 8:
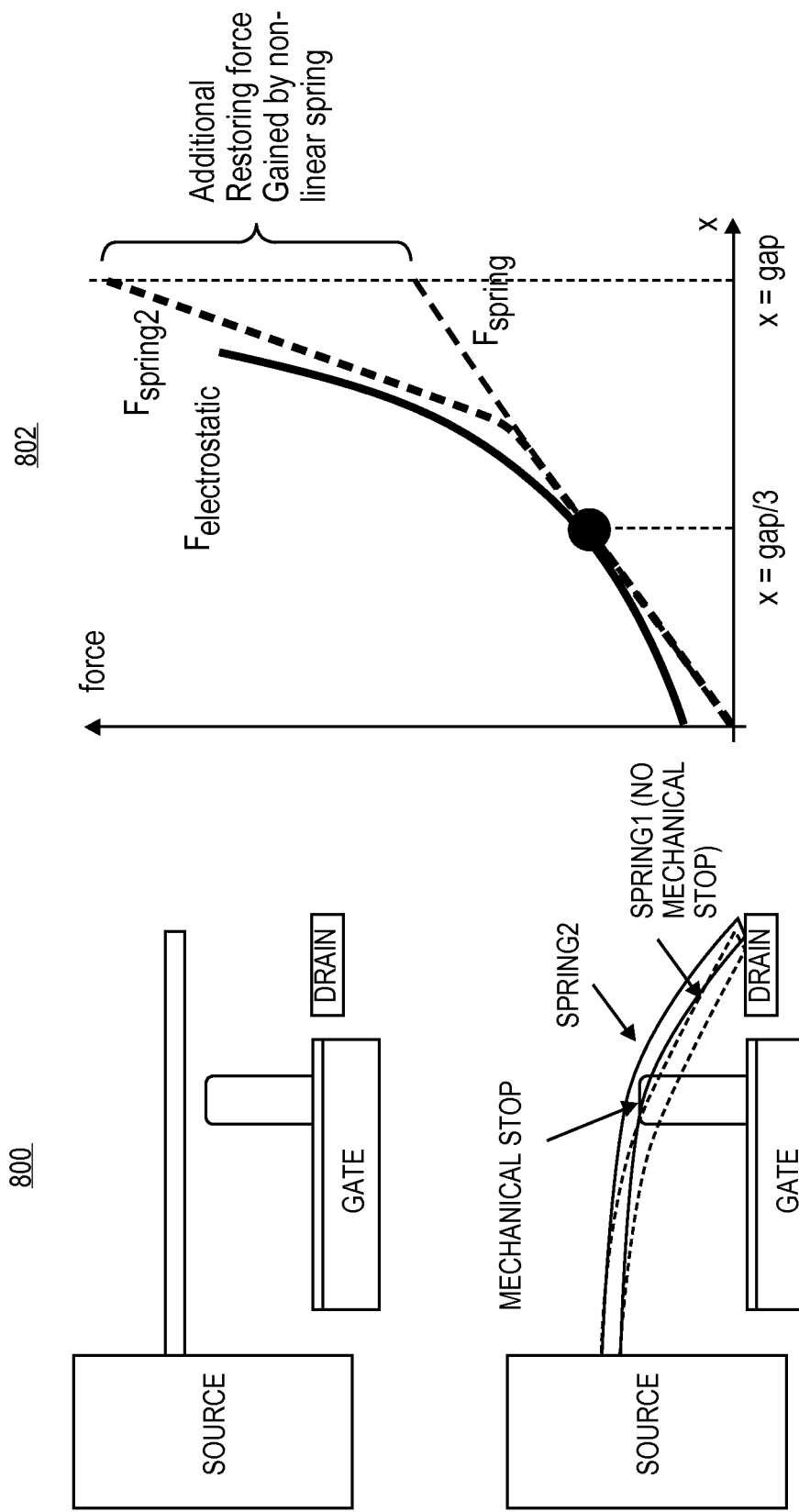
FIG. 8 includes a schematic of nonlinear beam with mechanical stop, and a corresponding plot demonstrating an improvement of spring restoring force without an increase in actuation voltage, in accordance with an embodiment of the present invention.

With reference to FIG. 8, voltage applied to a cantilever system introduces an attractive force which brings the electrodes closer together. The applied voltage also displaces the mechanical system and introduces a spring restoring force. The system is in equilibrium when the electrostatic force and the mechanical restoring force are balanced. The voltage where the electrostatic force is larger than the mechanical force for all "gaps" is known as the pull-in voltage. Under a conventional relay system, the electrostatic force increases proportionally to the inverse of the square of the gap distance, while the spring restoring force increases proportionally to the gap distance. The pull-in voltage occurs when the gap is ⅔ the distance of the original gap. At all electrode distances smaller than this, the electrostatic force is greater than the mechanical restoring force.

Nonlinear springs resemble linear spring up until the gap distance where pull-in occurs. Thus, the pull-in voltage has not changed. However, at distances after pull-in, the spring restoring force increases nonlinearly such that at contact, the mechanical spring restoring force is greater than that of a linear system. Nonlinear springs can be engineered through a variety of systems, including introducing one or more mechanical stops such that when the cantilever hits the mechanical stop, the effective cantilever length is shortened and the effective spring constant increases. While this geometry introduces another surface where adhesion needs to be overcome, in an embodiment, the mechanical stop is placed closer to the clamped end of the cantilever such that the effective beam length is shorter and the mechanical restoring force is greater.

In an embodiment, an additional benefit to the geometry described in association with FIG. 8 is that the requirements of the electrical contact are separated from that of a mechanical contact. In a traditional cantilever relay geometry, the electrical contact surface should be maximized to minimize contact resistance. However, maximizing the electrical contact area will also increase adhesion forces which are undesirable. Furthermore, metal-metal contacts which have desirable electrical characteristics also exhibit high adhesion forces. With the nonlinear spring geometry, in accordance with an embodiment of the present invention, the mechanical contact geometry and material can be optimized to minimize adhesion forces, and the effective restoring point at the electrical contact is much higher than that of a traditional geometry.

Figure 9:
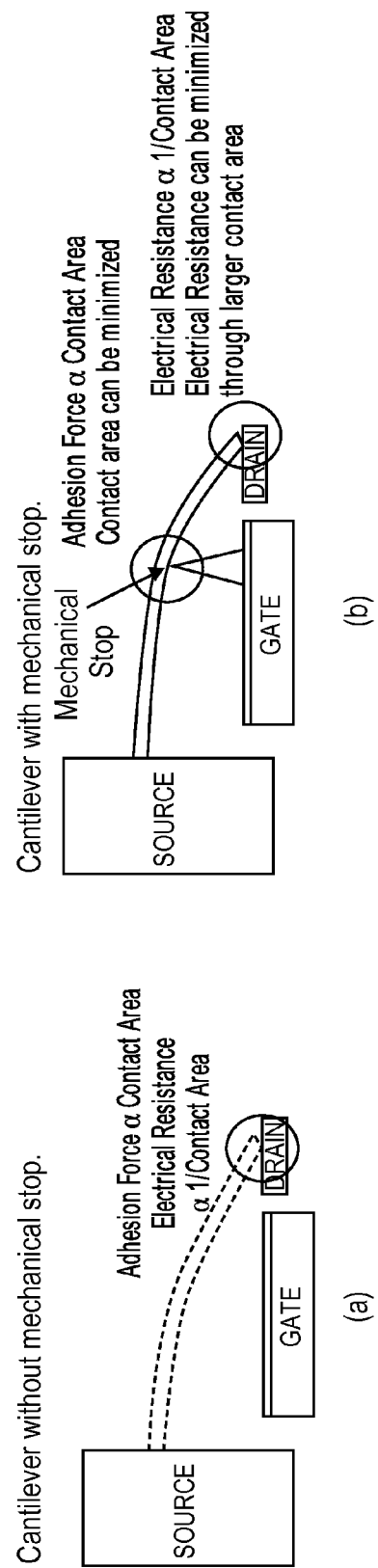
FIG. 9 is a schematic illustrating a comparison of (a) a cantilever without a mechanical stop and (b) a cantilever with a mechanical stop, in accordance with an embodiment of the present invention.

FIG. 9 is a schematic 900 illustrating a comparison of (a) a cantilever without a mechanical stop and (b) a cantilever with a mechanical stop, in accordance with an embodiment of the present invention. Referring to FIG. 9, an advantage from using the mechanical stop to optimize the adhesion characteristics of the mechanical bump while allowing for a large electrical contact area is depicted.

Figure 10:
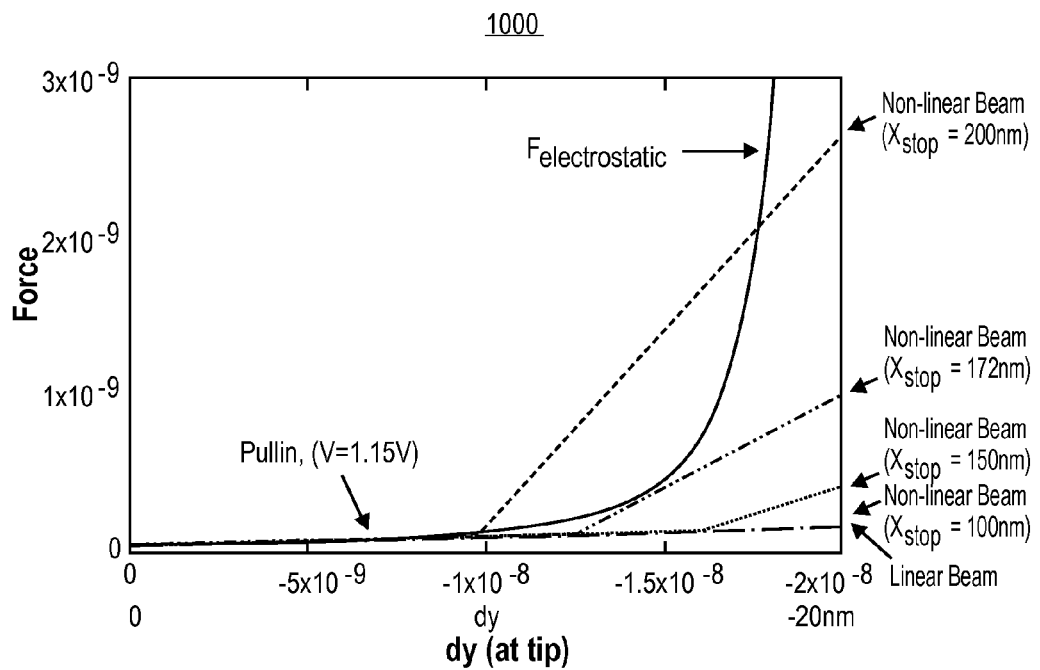
FIG. 10 is a plot showing analytical results for spring geometry with mechanical bump, in accordance with an embodiment of the present invention.

Simulations of a typical nanorelay system are shown in FIG. 10, which includes a plot 1000 showing analytical results for spring geometry with mechanical bump, in accordance with an embodiment of the present invention. The cantilever beam has a length of 300 nm, width of 10 nm, and height of 10 nm. Mechanical stops are placed 100 nm, 150 nm, 170 nm, and 200 nm from the clamped edge of the cantilever and 5 nm below the neutral plane of the cantilever. Analytical results show that for mechanical stop placements at 150 nm, and 170 nm, the restoring force is increased without increasing the pull-in voltage.

Figure 11:
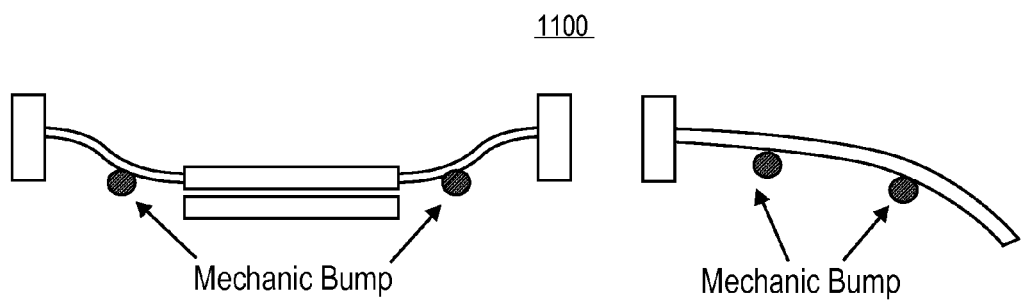
FIG. 11 is a schematic illustrating possible geometrical variations of non-linear springs using mechanical bumps, in accordance with an embodiment of the present invention.

The above described concept can similarly be implemented for doubly-clamped cantilevers (also known as bridges). Furthermore, several mechanical bumps can be used to further optimize the geometry. As an example, FIG. 11 is a schematic 1100 illustrating possible geometrical variations of non-linear springs using mechanical bumps, in accordance with an embodiment of the present invention.

Figure 12:
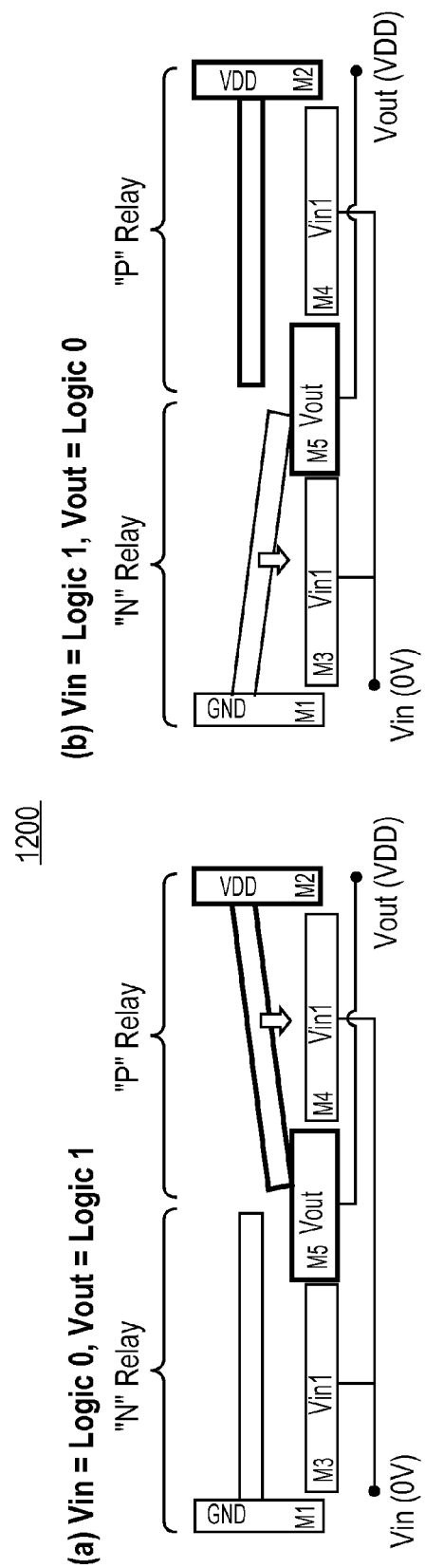
FIG. 12 is a schematic illustrating a complimentary relay inverter where (a) the input is off and the output is on, and (b) the input is on and the output is off, in accordance with an embodiment of the present invention.

In a fourth aspect, in accordance with another embodiment of the present invention, a device or devices for complimentary logic are described. By way of comparison, FIG. 6 shows the operation of a complimentary inverter utilizing two nanowire relays from FIG. 2, labeled P-Relay and N-Relay. All of the gates of the two relays (M3 and M4) are electrically connected and is the input of the inverter, labeled Vin1. Relays make contact with M5, which is the output of the inverter and is labeled Vout. The "P" relay (M2) is connected to the reference on state voltage, and "N" relay (M1) is connected to the reference off state voltage. Physical operation of each relay is similar to the simple relay switch in FIG. 2. FIG. 12 is a schematic 1200 illustrating a complimentary relay inverter where (a) the input is off and the output is on, and (b) the input is on and the output is off, in accordance with an embodiment of the present invention.

Referring to FIG. 12(*a*), an input with the off state voltage causes the P-Relay to turn on (connecting the output M5 to M2) and the N-Relay to turn off, resulting in an output with the on state voltage (inverted from the input). Shown in FIG. 12(*b*), an input with the on state voltage causes the N-Relay to turn on (connecting the output M5 to M1) and the P-Relay to turn off, resulting in an output with the off state voltage (inverted from the input). The off states shown in FIG. 12 corresponds to the off state in FIG. 2(*c*), but it can also be the off state in FIG. 2(*a*).

In an embodiment, advantages of the above include providing of a complimentary layout for an inverter allows the output of the device to always be defined without connecting it to a resistive load to a reference potential, which would otherwise be a source of energy loss. The behavior is similar to a typical CMOS inverter over a simple n-type-only or p-type-only MOS inverter. In addition, in an embodiment, it is possible to fabricate complimentary NAND, NOR, and XNOR logic gates with only two relays, by using structures containing multiple gates per relay. As an example, FIG. 13 is a schematic 1300 illustrating complementary logic (a) NOR, (b) NAND, and (c) XNOR relays utilizing multiple gates (input) per relay, in accordance with an embodiment of the present invention.

Figure 13A:
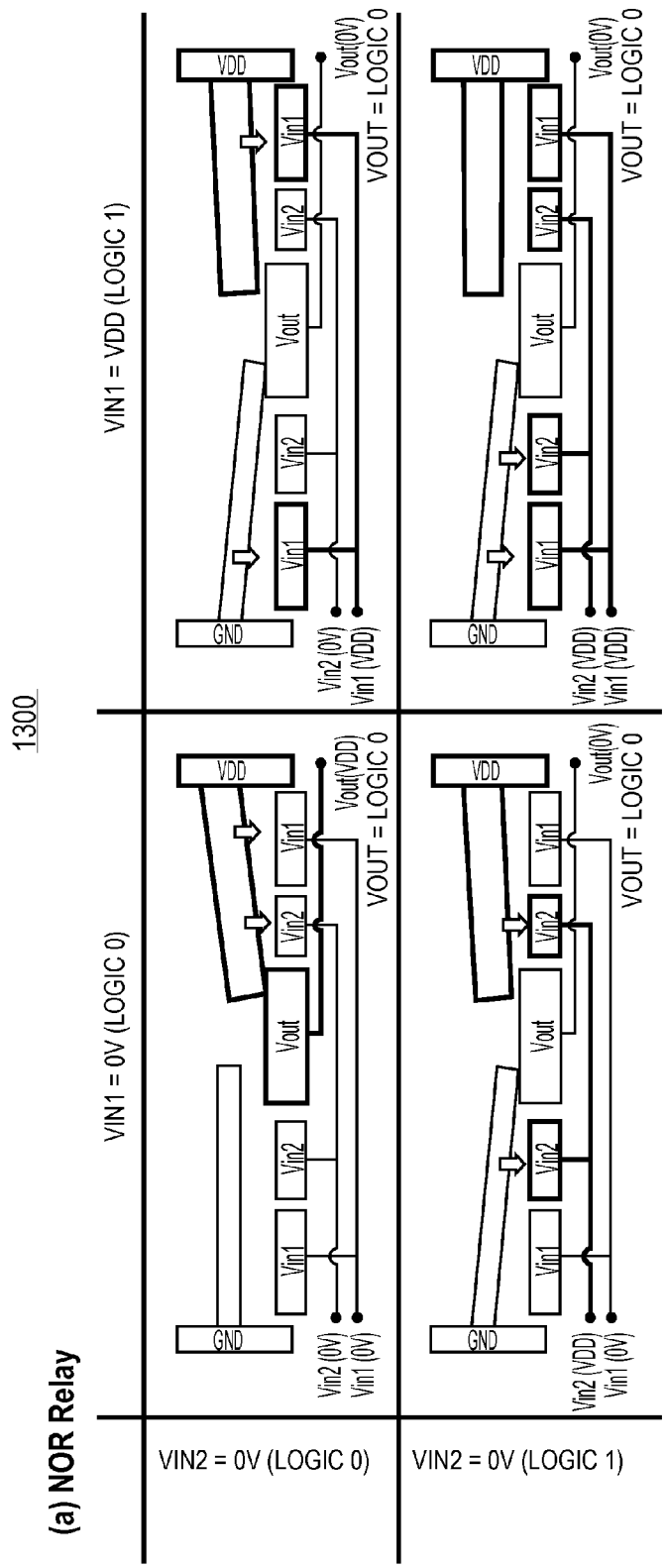
FIG. 13 is a schematic illustrating complementary logic (a) NOR, (b) NAND, and (c) XNOR relays utilizing multiple gates (input) per relay, in accordance with an embodiment of the present invention.
Figure 13B:
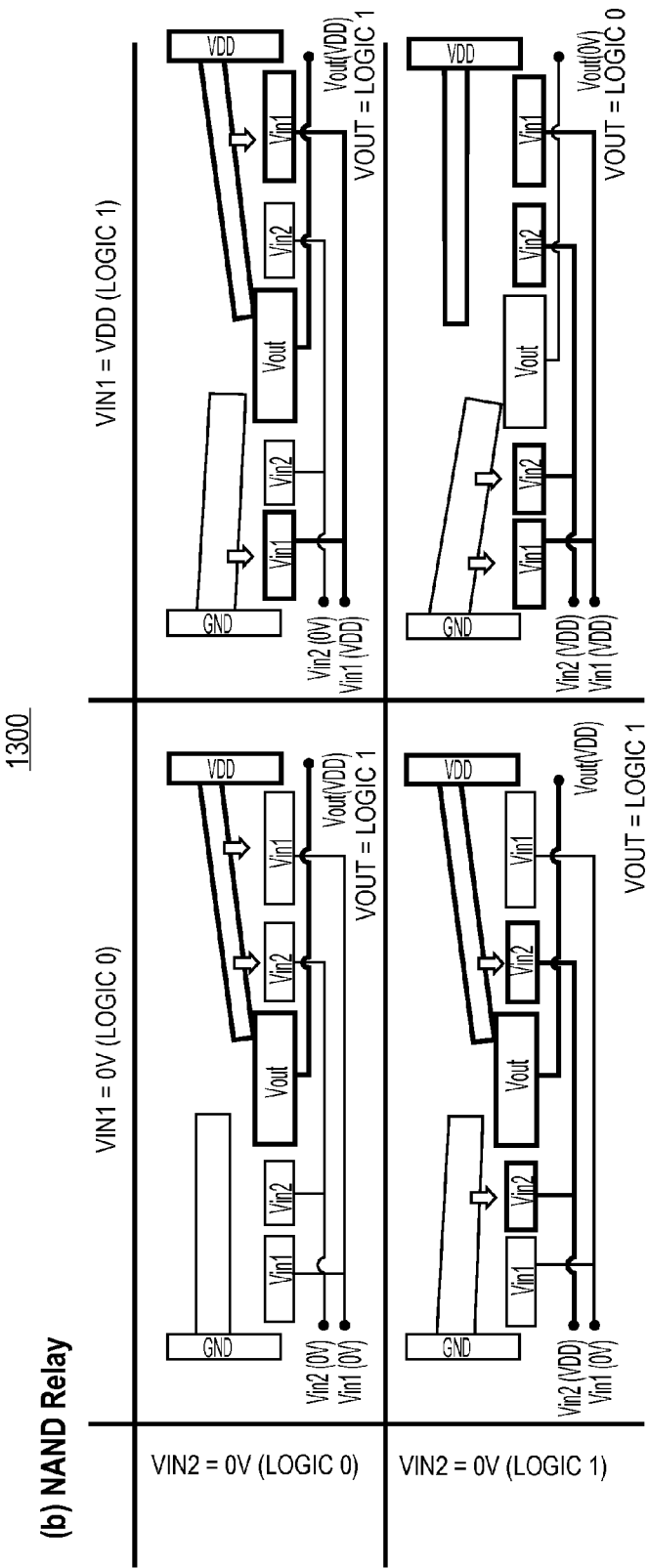
Figure 13C:
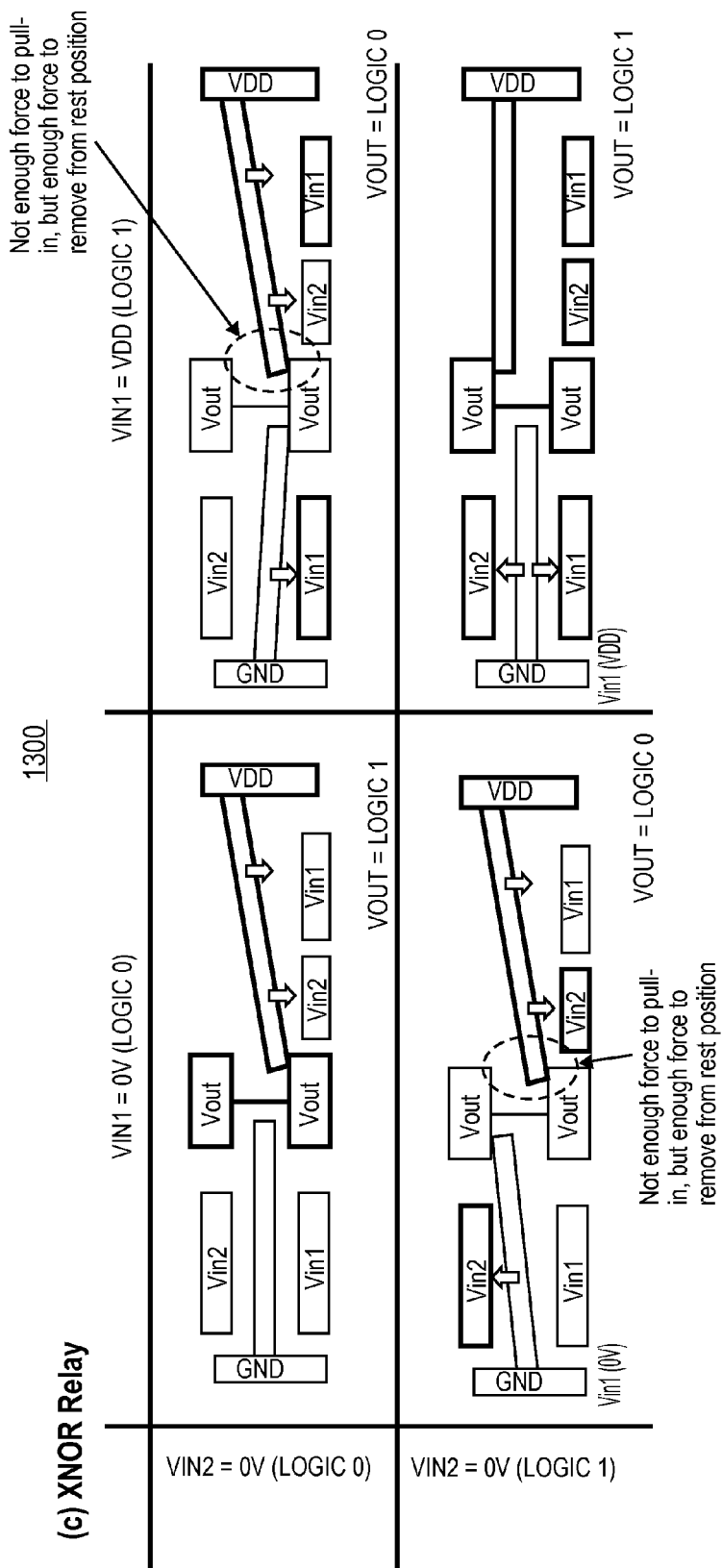

Referring to FIG. 13, complexity is reduced as compared to traditional CMOS logic. The designs uses differently sized beams such that it may take one or multiple gates to pull-in the relay. For example, with the NOR logic relay, the relay which is connected to VDD has a large spring constant (is stiff) such that a potential difference from both Vin1 and Vin2 is needed to engage, while the relay connected to GND has a small spring constant (is complaint), so it can engage when either Vin1 or Vin2. Therefore, the output is connected to VDD only when Vin1=0 and Vin2=0. For other scenarios, the output is connected to GND. Similar approaches are used for NAND, and XNOR. The concept of using multiple gates per relay can be, in an embodiment, extended to three or more inputs by placing all the inputs beneath the beam, and also non-inverting logic (AND, OR, XOR).

Figure 14:
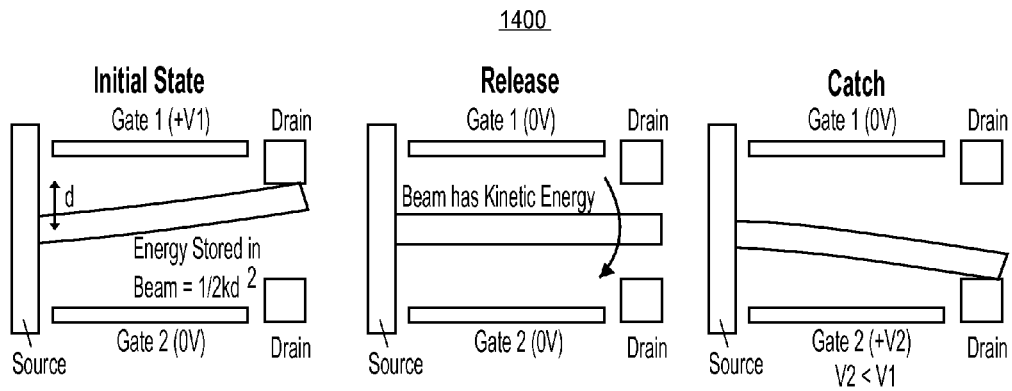
FIG. 14 is a schematic illustrating the advantage of using stored energy in a beam in a catch and release mechanism to reduce actuation voltage and switching energy, in accordance with an embodiment of the present invention.
Figure 15:
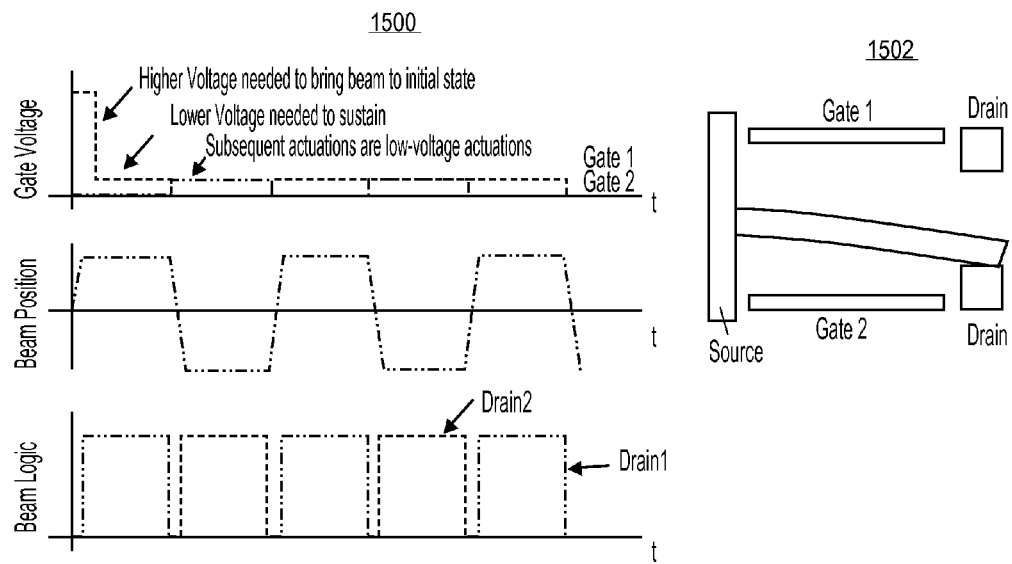
FIG. 15 is a timing diagram and corresponding schematic of a catch and release relay, in accordance with an embodiment of the present invention.

In a fifth aspect, in accordance with another embodiment of the present invention, a catch and release relay is described. As an example, FIG. 14 is a schematic 1400 illustrating the advantage of using stored energy in a beam in a catch and release mechanism to reduce actuation voltage and switching energy, in accordance with an embodiment of the present invention. FIG. 15 is a timing diagram 1500 and corresponding schematic 1502 of a catch and release relay, in accordance with an embodiment of the present invention.

Referring to FIGS. 14 and 15, the catch and release relay structure may include a single or double clamped cantilever beam, with two gates, which actuate the relay in opposing directions. The structure also includes a top and bottom contact, such that a current path is established when the beam touches either contact. When a mechanical relay is actuated, energy is stored as potential energy in the beam. In a typical relay configuration, the stored energy is dissipated when the relay switches, such that the relay switching energy is calculated to be the energy stored in the beam. However, in one embodiment, the double-gate relay structure can reuse most of this energy. As the beam is released from one contact, the stored potential energy is converted into kinetic energy, which helps bring the beam closer to the opposing contact and significantly reduce the switching energy and actuation voltage of the structure. Mechanical structures typically have "Q" factors exceeding 100, meaning that less than 1 percent of the energy is dissipated per oscillation, and thus the majority of the stored energy of the relay can be reused. It is to be understood that when a mechanical relay is actuated, it gains kinetic energy due to its motion. In a typical relay configuration, this kinetic energy is dissipated when the relay switches, and is a component of its switching energy loss. The elastic potential energy of the spring in the relay is not necessarily "lost" in a switching cycle, it is the kinetic energy that is lost. The other component of the switching energy of a relay is the capacitive energy from charging, which is lost in a switching cycle.

The associated actuation voltages and energies to provide the beam in the initial state are higher than subsequent release and catch operations. However, in an embodiment, subsequent actuations require much lower voltage. Lowering the actuation voltage may help circumvent the "adhesion properties" inherent to nanomechanical relays, as springs can be designed to be stiffer to have sufficient spring restoring force, and yet have a low-voltage actuation for subsequent actuations. The catch and release relay can be used in an inverter or logic gate device. Lower-voltage actuation may render the device more compatible with front-end CMOS processes.

Figure 16:
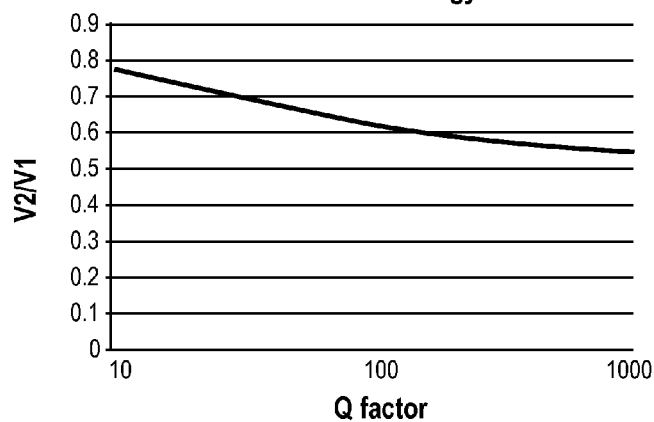
FIG. 16 is a plot estimating reduction in actuation voltage from the catch and release strategy for a singly clamped cantilever beam, in accordance with an embodiment of the present invention.

For further demonstration, FIG. 16 is a plot 1600 estimating reduction in actuation voltage from the catch and release strategy for a singly clamped cantilever beam, in accordance with an embodiment of the present invention. V1 is the voltage needed for initial actuation (and subsequent actuation if the catch and release mechanism is not employed), and V2 is the reduced voltage needed to "catch" the beam.

In a sixth aspect, in accordance with another embodiment of the present invention, a hybrid MOS-relay transistor with disconnecting source is described. As an example, FIG. 17 is a schematic 1700 illustrating a hybrid MOS-relay transistor (a) in the disabled state, (b) where the MOS gate is activated and inversion channel forms, and (c) where the nanowire is in contact with the source, enabling the transistor, in accordance with an embodiment of the present invention.

Figure 17:
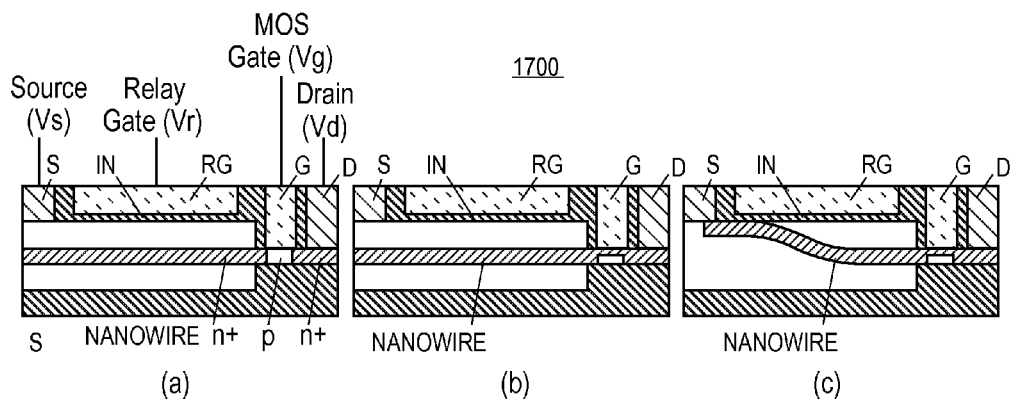
FIG. 17 is a schematic illustrating a hybrid MOS-relay transistor (a) in the disabled state, (b) where the MOS gate is activated and inversion channel forms, and (c) where the nanowire is in contact with the source, enabling the transistor, in accordance with an embodiment of the present invention.

Referring to FIG. 17, a hybrid MOS relay is shown, where a conventional MOS gate (with voltage Vg) and drain (with voltage Vd) is placed in the anchor region for the nanowire. The MOS gate and drain may wrap around the nanowire. In an embodiment, the nanowire is a doped semiconductor, with an opposite doping in the region under the MOS gate (p-type doping is shown in FIG. 17). The source of the transistor is not connected to the nanowire in the initial off state. The relay gate (with voltage Vr) is connected to a reference voltage. However, in an embodiment, the relay gate is optional and can be replaced with a larger source region.

Referring again to FIG. 17, in order to connect the nanowire to the source, enabling the transistor, Vd is set to the reference drain voltage, and Vr is set to a reference voltage that is different than Vd, such as the ground voltage. Vg is set such that an inversion layer forms in the nanowire underneath the MOS gate, as shown in FIG. 7(b). This arrangement causes a potential difference to form between the relay gate and source to the nanowire. The nanowire moves towards the source and contacts the source, as shown in FIG. 17(c). The contact creates a conduction path from the source to the drain. The MOS gate can then function as a typical transistor gate. However, if the inversion layer is removed for too long, the nanowire will disconnect from the source. Since the electrical switching can occur much faster than mechanical motion, in an embodiment, the nanowire remains connected to the source provided the inversion layer exists above a critical duty cycle over time.

To disconnect the nanowire from the source, disabling the transistor, Vg is changed such that the underlying inversion layer in the nanowire is removed for a sufficiently long period of time. This causes the potential of the nanowire to move towards the potential of the source or the relay gate, if present. Since the potential difference is reduced or removed, the force supporting the nanowire is reduced or removed. Thus, the nanowire moves away from the source, disconnecting from it, and returns to its initial position in FIG. 17(a). At that point, there is no conduction path from the source to the drain.

In an embodiment, advantages as compared to typical CMOS transistors include that such a hybrid transistor has virtually zero off-state current from the source to drain because the conductive element (e.g., the nanowire) physically disconnects from the source. Compared to a mechanical switch (e.g., as in FIG. 2), the hybrid transistor switches more quickly due to the switching mechanism coming from the changing electron energy levels in the MOS transistor, which is a relatively rapid process.

In a seventh aspect, in accordance with another embodiment of the present invention, power gating MOS transistors with a nanowire relay are described. As an example, FIG. 18 is a circuit schematic 1800 of a relay controlling power to two CMOS inverters, in accordance with an embodiment of the present invention.

Figure 18:
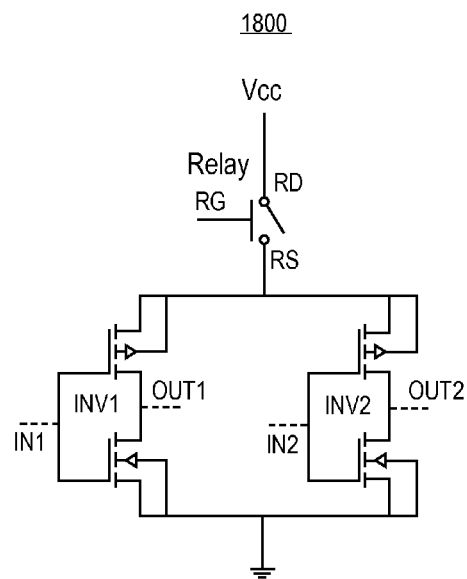
FIG. 18 is a circuit schematic of a relay controlling power to two CMOS inverters, in accordance with an embodiment of the present invention.

Referring to FIG. 18, a possible circuit where a nanowire relay from FIG. 2 is gating power to two CMOS inverters (INV1 and INV2) is shown. However, it is to be understood that any type and numbers of circuits can be used (e.g., if the relay can carry sufficient current). RG, RD, and RS on the nanowire relay correspond in FIG. 2 to Gate, Terminal 1, and Terminal 2, respectively. Vcc is a supply voltage. When the relay is off, no power is provided to the MOS transistors. When the relay is on, power to the MOS transistors is provided, and the devices operate like typical CMOS inverters. The nanowire in the relay can, in an embodiment, be fabricated from the same semiconductor material as the MOS transistors.

In an embodiment, an advantage includes the use of a nanowire relay instead of a MOS transistor to gate power to MOS circuits to enable lower energy utilization. Less energy is utilized since a relay has smaller switching energy than a MOS gating transistor, and does not leak current from its terminals when in the off state. The lower energy utilization also leads to a thermally cooler switch. Additionally, fine-grain power gating can be achieved with such a nanowire relay, as the fabrication process is similar to the MOS transistors, and the main element can be the primary semiconductor material used in the MOS devices.

In an eighth aspect, in accordance with another embodiment of the present invention, a non-volatile nano-mechanical memory device is described. As an example, FIG. 19 is a schematic 1900 illustrating a mechanical NVM device in (a) an initial off state of the memory cell, (b) the on state where the bit line is connected to the reference, and (c) an alternate off state, in accordance with an embodiment of the present invention.

Figure 19:
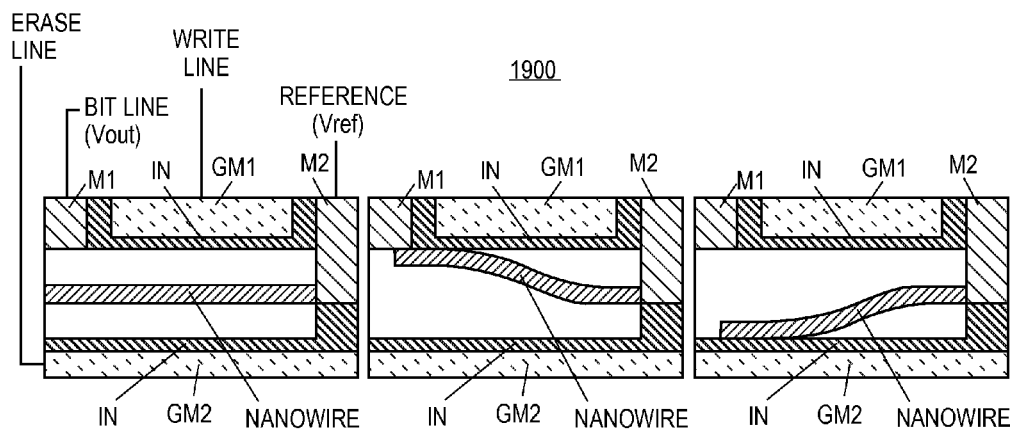
FIG. 19 is a schematic illustrating a mechanical NVM device in (a) an initial off state of the memory cell, (b) the on state where the bit line is connected to the reference, and (c) an alternate off state, in accordance with an embodiment of the present invention.

Referring to FIG. 19, a nanowire relay operating as a non-volatile memory (NVM) device is shown. M1 is the bit line, with voltage Vout. This is the bit state of the memory cell. M2 is connected to a reference on-state voltage, Vref. GM1 is the write line, and GM2 is the erase line. To set the bit state of the memory cell to on, the write line is utilized to apply a voltage onto GM1, creating a voltage difference between GM1 and M2. The nanowire moves towards GM1 and contacts M1, connecting M1 to M2, as shown in FIG. 9(b). The voltage on M1 is now Vref, and the bit state is on. If the voltage difference between GM1 and M2 is removed, e.g., if power to the device is lost, the nanowire will remain stuck to M1 due to engineered interfacial adhesion. Thus, the state is non-volatile.

To set the bit state of the memory cell to off, the erase line is utilized to apply a voltage onto GM2, creating a voltage difference between GM2 and M2. The nanowire moves towards GM2, disconnecting from M1, as shown in FIG. 19(c). Since M1 is no longer connected to M2, the bit state is off. If the voltage difference between GM2 and M2 is removed, e.g., if power to the device is lost, the nanowire can remain connected to the GM2 side due to interfacial adhesion, or it can return to the state in FIG. 19(a) depending on the device parameters. In any case, M1 and M2 do not have a conductive path, and the bit cell remains in the off state. Thus, the state is non-volatile.

The device in FIG. 19 is shown with two possible states. However, it is to be understood that more states can exist if there are additional bit lines and write lines surrounding the nanowire. As an example, in one embodiment, four memory states can be achieved if additional bit and write lines are included in a perspective behind the page and above the page. Additionally, the device can be coupled to CMOS circuitry for providing reading and writing capabilities, and can be tightly integrated due to the similar fabrication process. Advantages include, in an embodiment, fabrication of a NVM relay device having a security advantage of not holding an electrical charge per bit state. This prevents invasive reverse engineering methods, such as SEM passive voltage contrast, from reading the state.

Figure 20:
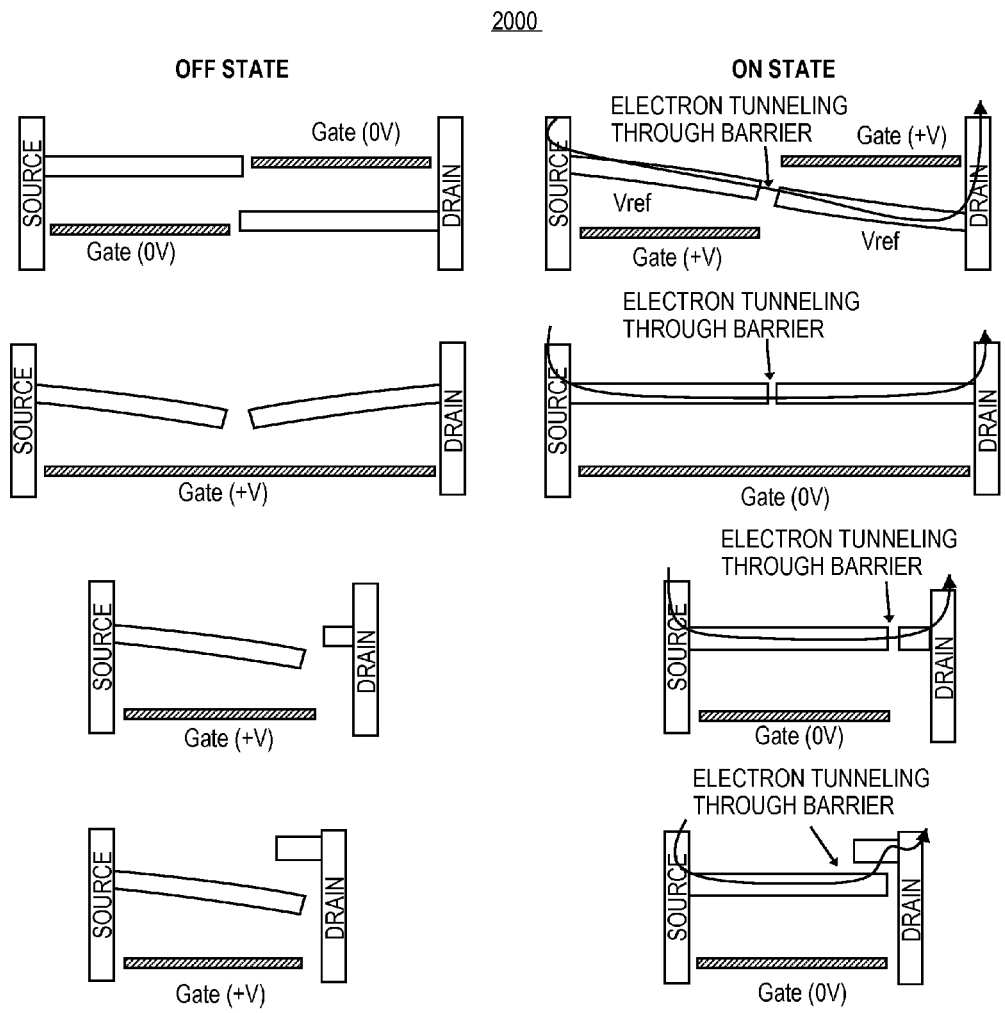
FIG. 20 is a schematic illustrating several electron tunneling relay geometries, where the left portion of the schematic illustrates the off-state of the relay and the right portion of the schematic illustrates the on-state of the relay, in accordance with an embodiment of the present invention.

In a ninth aspect, in accordance with another embodiment of the present invention, an electron tunneling relay is described. As an example, FIG. 20 is a schematic 2000 illustrating several electron tunneling relay geometries, where the left portion of the schematic illustrates the off-state of the relay and the right portion of the schematic illustrates the on-state of the relay, in accordance with an embodiment of the present invention. Relay actuation voltages are indicated beneath the gate electrode for each diagram.

Figure 29:
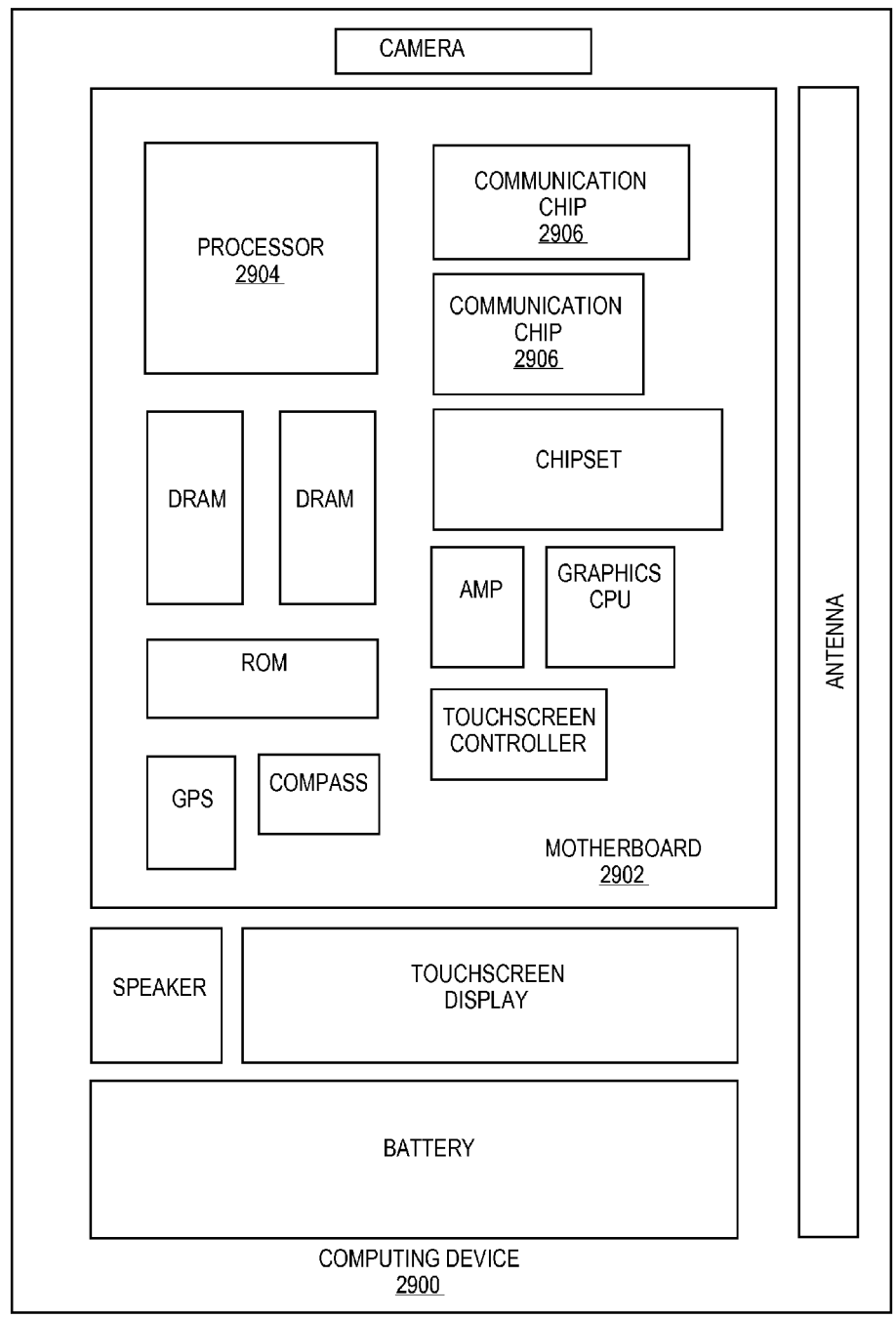
FIG. 29 illustrates a computing device in accordance with one embodiment of the invention.

Referring to FIG. 29, surface adhesion forces between electrical contacts make switching more difficult for relay structures. To mitigate this problem, the relay geometry can be designed such that one or more beams come in close enough to allow current conduction through electron tunneling, but still far enough away to minimize surface adhesion forces. Electron tunneling allows electrons to pass through a finite potential barrier (such as air) without physical contact between two electrodes. Since the beam does not need to overcome surface adhesion forces to release the structure, these structures can be designed with compliant springs and a low actuation voltage. Actuation voltage is further reduced because the relays do not need a large mechanical displacement to turn-on, as with a typical relay mechanism.

Figure 21:
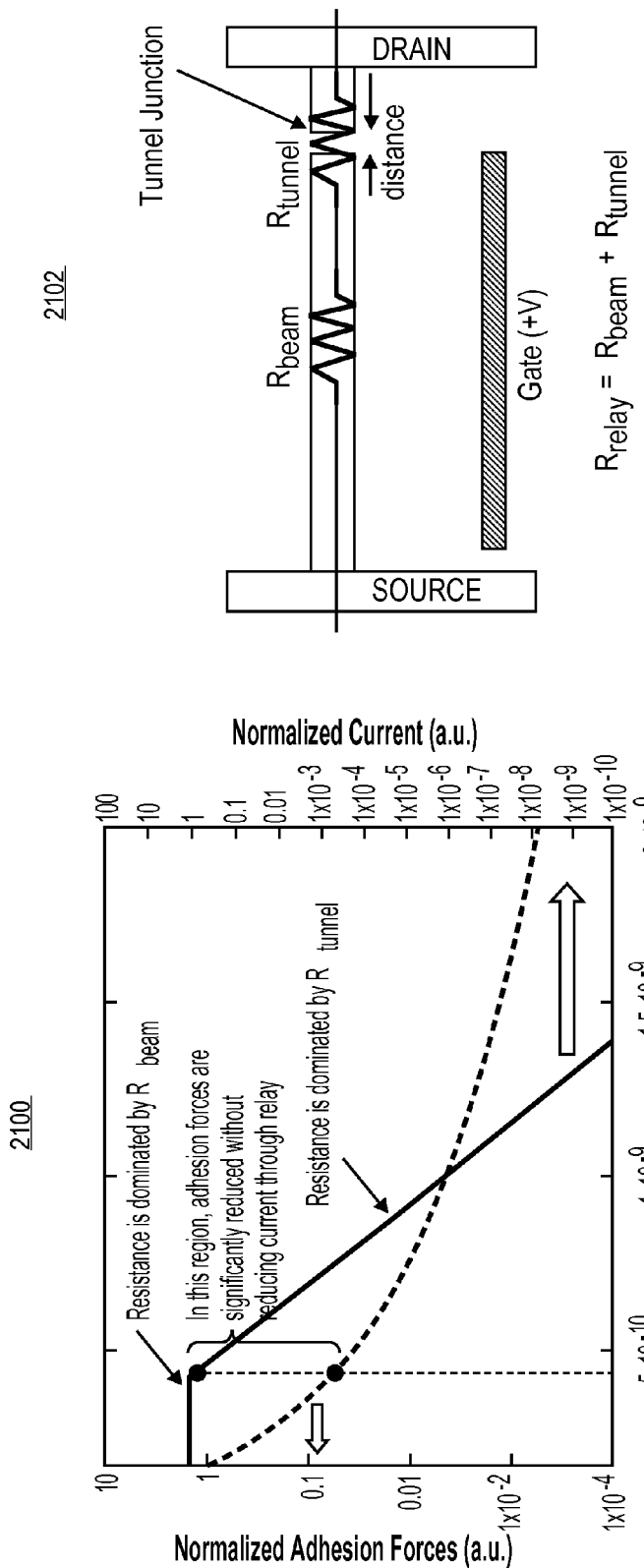
FIG. 21 is a normalized plot of adhesion forces, and relay current as a function of distance of the tunnel junction based on the includes relay schematic, in accordance with an embodiment of the present invention.
Figure 22:
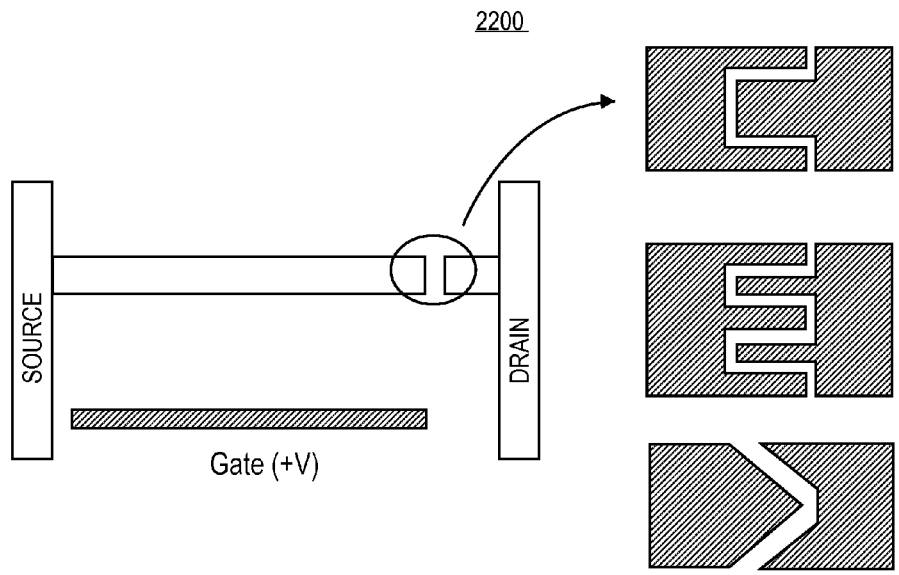
FIG. 22 is a schematic illustrating different junction geometries available for increasing surface area for electron tunneling, in accordance with an embodiment of the present invention.

FIG. 21 is a normalized plot 2100 of adhesion forces, and relay current as a function of distance of the tunnel junction based on the includes relay schematic 2102, in accordance with an embodiment of the present invention. A design point exists where adhesion forces can be reduced while maintaining similar currents through the relay. FIG. 22 is a schematic 2200 illustrating different junction geometries available for increasing surface area for electron tunneling, in accordance with an embodiment of the present invention.

Referring to FIG. 21, a simulation and model of a relay with a tunnel junction is shown. The resistance through the relay is the sum of the resistance through the beam and the resistance through the tunnel junction. At short distances where electron tunneling is probable, the relay resistances is dominated by the resistance through the beam, whereas for long distances, the electron tunneling resistance is dominant. FIG. 21 also describes Van der Waals adhesion forces as a function of gap distance. In an embodiment, there exists a design point where the adhesion forces can be significantly reduced without impacting the resistance through the relay. Different relay contact structures can also be utilized to increase the surface area of the tunnel junction, as shown in FIG. 22.

Figure 23:
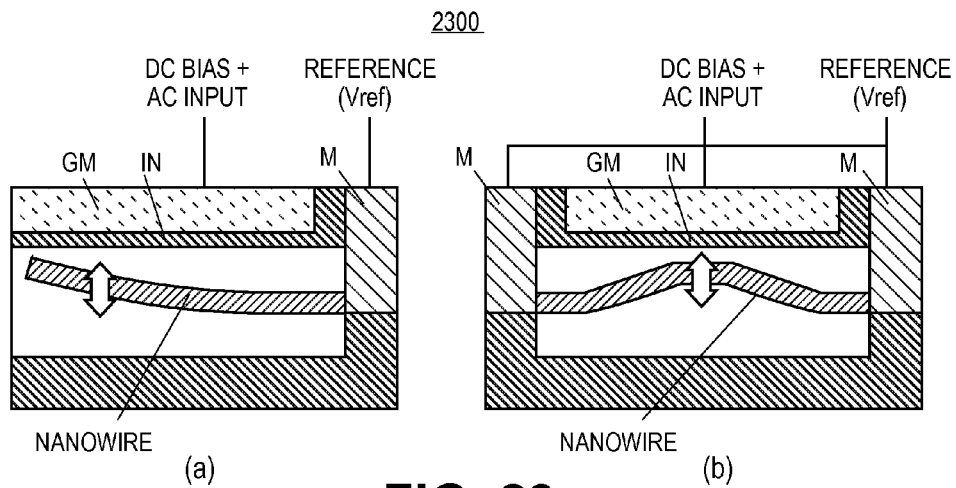
FIG. 23 is a schematic illustrating mechanical resonating oscillators using nanowires (a) anchored on one side and (b) anchored on both sides, in accordance with an embodiment of the present invention.

In a tenth aspect, in accordance with another embodiment of the present invention, a mechanical resonating oscillator is described. As an example, FIG. 23 is a schematic 2300 illustrating mechanical resonating oscillators using nanowires (a) anchored on one side and (b) anchored on both sides, in accordance with an embodiment of the present invention. A small AC input is applied on top of a DC polarization bias that is smaller than the pull-in voltage. At the resonant frequency, a larger reactance current may be induced between the nanowire and the gate due to the mechanical resonance of the wire (represented as arrows).

Referring to FIG. 23, then, another possible application of the nano-mechanical structure as an RF resonator is shown. A DC polarization voltage that is smaller than the pull-in voltage is applied across the gate (GM) and the nanowire so that the wire is deflected by a small amount. The amount the nanowire deflects is small such that it does not come into contact with the gate (the insulator on the gate is not strictly necessary). Superimposed on the DC voltage is a small AC voltage, which is applied to excite the mechanical resonant modes of the nanowire. At the resonant frequency, in addition to the inherent AC current across the capacitor due to the time-varying voltage, a larger reactive current may be induced due to the resonating movement of the nanowire, which results in the time-varying reactance.

Figure 24:
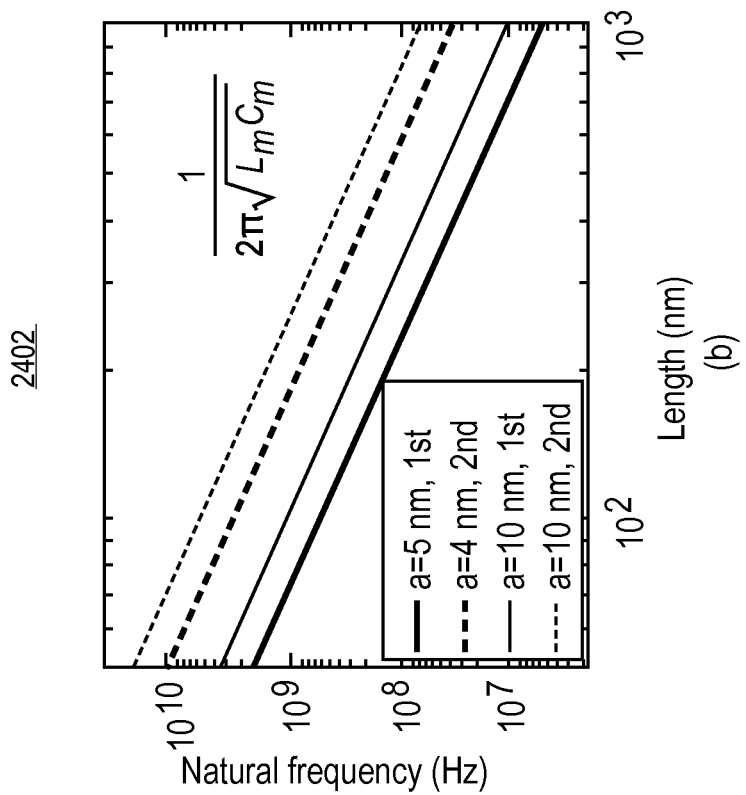
FIG. 24 includes (a) a diagram of a small-signal electrical equivalent circuit of a nano-mechanical resonator, and (b) a plot of calculation results for the natural frequencies ($1^{st}$ and $2^{nd}$ modes) of nanowires that are anchored on one side and have various lengths from 50 nm to 1 µm and thicknesses of 5 nm and 10 nm, in accordance with an embodiment of the present invention.
Figure 24:
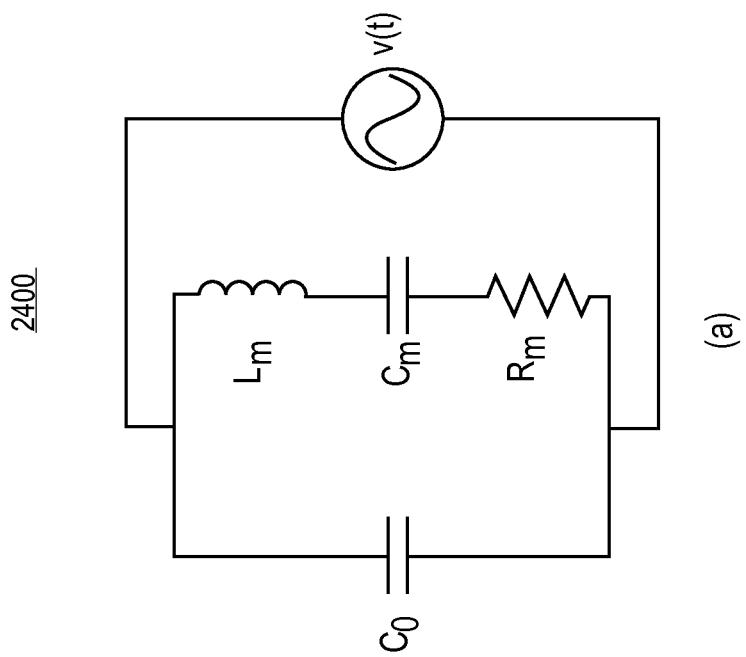

FIG. 24 includes (a) a diagram 2400 of a small-signal electrical equivalent circuit of a nano-mechanical resonator, and (b) a plot 2402 of calculation results for the natural frequencies (1st and 2nd modes) of nanowires that are anchored on one side and have various lengths from 50 nm to 1 μm and thicknesses of 5 nm and 10 nm, in accordance with an embodiment of the present invention.

Referring to FIG. 24(a), the electrical equivalent circuit of the nano-mechanical resonator is shown. For an AC voltage v(t) with t being the time, in addition to the normal current path through the static capacitor CO, there is a parallel current path through the resonance circuit with inductance, capacitance, and resistance of Lm, Cm, and Rm, respectively. The subscript m means that they originate from mechanical motion of the nanowire. In the small-signal limit, $Lm=M/\eta 2$ and $Cm=\eta 2/K$, where M and K are the mass and the effective spring constant of the beam, respectively. The η is the electromechanical transduction factor defined as $\eta=\in AVp/g2$, where c is the permittivity, A is the capacitor area, Vp is the DC polarization voltage, and g is the gap thickness. The natural frequency of the nanowire is expressed as $1/2\pi\sqrt{L_m C_m}$. Note that the resistance comes from the damping as $Rm=\sqrt{KM}/Q\eta^2$, where Q is the quality factor. For a rectangular wire with thickness a, width b, and length L, $M=\rho abL$ with ρ being the mass density, and the classical beam theory giving $K=Eba3\alpha n4/12L3$ where E is the elastic modulus, and an is the nth wave number.

The operating frequency can be adjusted by changing the device structure, wire dimensions, and DC bias. For the same nanowire dimensions, the resonators that are anchored on one side (see FIG. 23(a)) show lower pull-in voltages and resonant frequencies than the ones that are anchored on both sides (see FIG. 23(b)). The resonant frequency is also modulated by the DC polarization voltage because the shape and the effective stiffness change as the nanowire is deflected. This enables electrically tunable resonator center frequencies. The resonant frequency also critically depends on the physical dimensions of the beam such as the length and thickness. FIG. 24(b) shows calculation results for the 1st and 2nd natural frequencies of nanowires that are anchored on one side and have different lengths and thicknesses. All other nanowire parameters are the same as those in FIG. 3. Note that the natural frequency increases as the length decreases and the thickness increases.

In an embodiment, advantages of the nano-mechanical oscillator include, but are not limited to, the ability to be integrated with CMOS so that on-chip, monolithic RF filter and oscillator components. The operating frequency can be chosen by changing beam dimensions and anchoring conditions across a wide range and can be further adjusted by DC bias conditions. The high volume CMOS-compatible process also enables the implementation of a large array of the resonating devices so that it can enhance the output signal.

Figure 25:
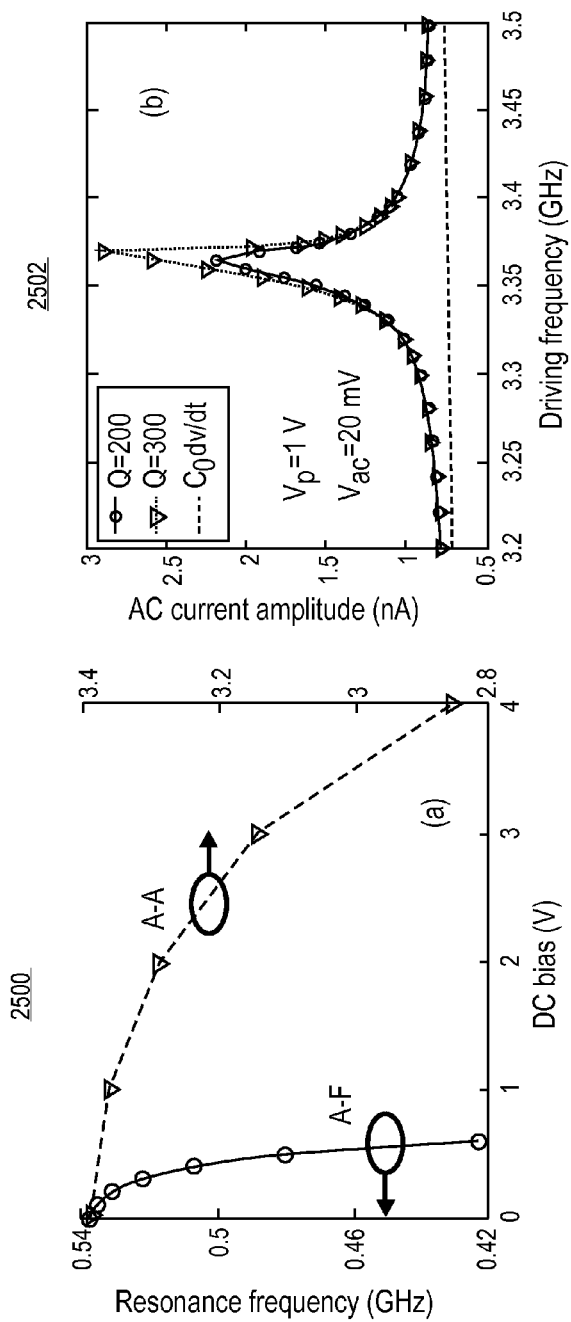
FIG. 25 includes (a) a plot of small-signal resonance frequency (1st mode) versus DC polarization voltage for wires anchored on one side (A-F) and anchored on both sides (A-A), and (b) a plot of frequency response of the AC current amplitude for the A-A structure, in accordance with an embodiment of the present invention.

FIG. 25 includes (a) a plot 2500 of small-signal resonance frequency (1st mode) versus DC polarization voltage for wires anchored on one side (A-F) and anchored on both sides (A-A), and (b) a plot 2502 of frequency response of the AC current amplitude for the A-A structure, in accordance with an embodiment of the present invention. The A-A structure shows higher pull-in voltage (a larger range of DC bias) and resonance frequency. In both cases, resonance frequency decreases as the DC bias increases. Near the resonance frequency, AC current magnitude shows a large peak due to the mechanical resonance of the wire, and the response increases with increasing Q.

Referring to FIG. 25, then, numerical simulation results for the nano-mechanical resonators are shown. The wire dimensions and modulus are the same as those in the simulations described in association with the device of FIG. 2. In FIG. 25(a), the resonant frequency (1st mode) versus DC polarization voltage is shown for the two cases, wires anchored on one side (anchored-free, "A-F") and anchored on both sides (anchored-anchored, "A-A"). The pull-in voltage and the resonant frequency are higher in A-A than in A-F. In both cases, the resonant frequency decreases as the DC bias increases. FIG. 25(b) shows the frequency response of the AC current magnitude for the A-A structure with Vp=1 V and an AC voltage with magnitude vac=20 mV. The response is compared to CO dv/dt, which represents the AC current flowing through a static parallel plate capacitor for the same AC input. Near the resonant frequency (approximately 3.37 GHz), the resonator shows a large AC current in addition to the background current due to the mechanical resonance of the wire, and the response increases as Q increases.

Figure 26:
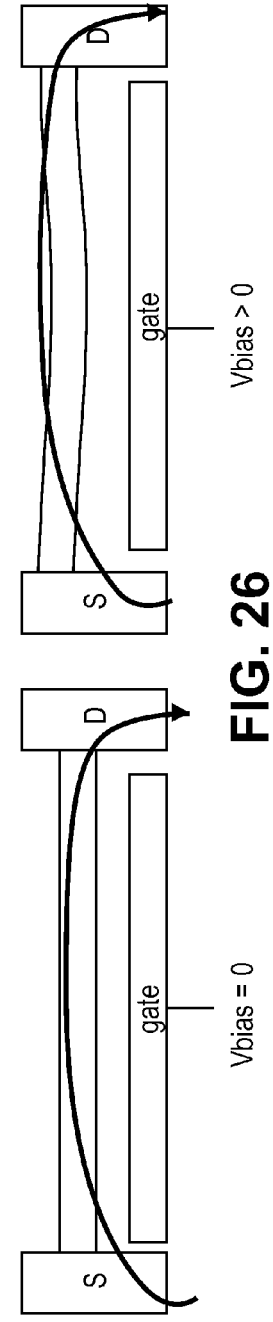
FIG. 26 is a schematic illustrating how gate bias introduces an attractive force between the relay and the gate electrode, which changes the strain of the mechanical beam and modulates the current through the beam and the source/drain electrodes, in accordance with an embodiment of the present invention.

In an eleventh aspect, in accordance with another embodiment of the present invention, current modulation through piezoresistive properties of silicon is described. As an example, FIG. 26 is a schematic 2600 illustrating how gate bias introduces an attractive force between the relay and the gate electrode, which changes the strain of the mechanical beam and modulates the current through the beam and the source/drain electrodes, in accordance with an embodiment of the present invention.

Generally, in an embodiment, a cantilever-like device can use mechanical movement or deformation to transduce a resistance change through the beam, which changes the current flowing through the device. The mechanical movement or deformation can be electrostatically controlled through a gate electrode, similar to how a gate electrode actuates a relay-like device. This device uses piezoresistive properties of silicon, where a mechanical deformation changes the strain on the beam, which transduces into resistance (and current) change through the beam and source and drain electrodes. One embodiment includes a device having a gate electrode, which is used to modulate the mechanical structure, and source and drain electrodes which connect the two ends of the cantilever. Referring again to FIG. 26, the device does not require a physical contact between metal electrodes, which reduces surface adhesion forces and increases device reliability. The device may also be used as an resonator device, where the gate electrode is used to drive the beam into resonance (AC signal), and change the resonant frequency from the natural frequency (DC signal). The sense signals are picked up through the resistance modulation of the beam.

Figure 27:
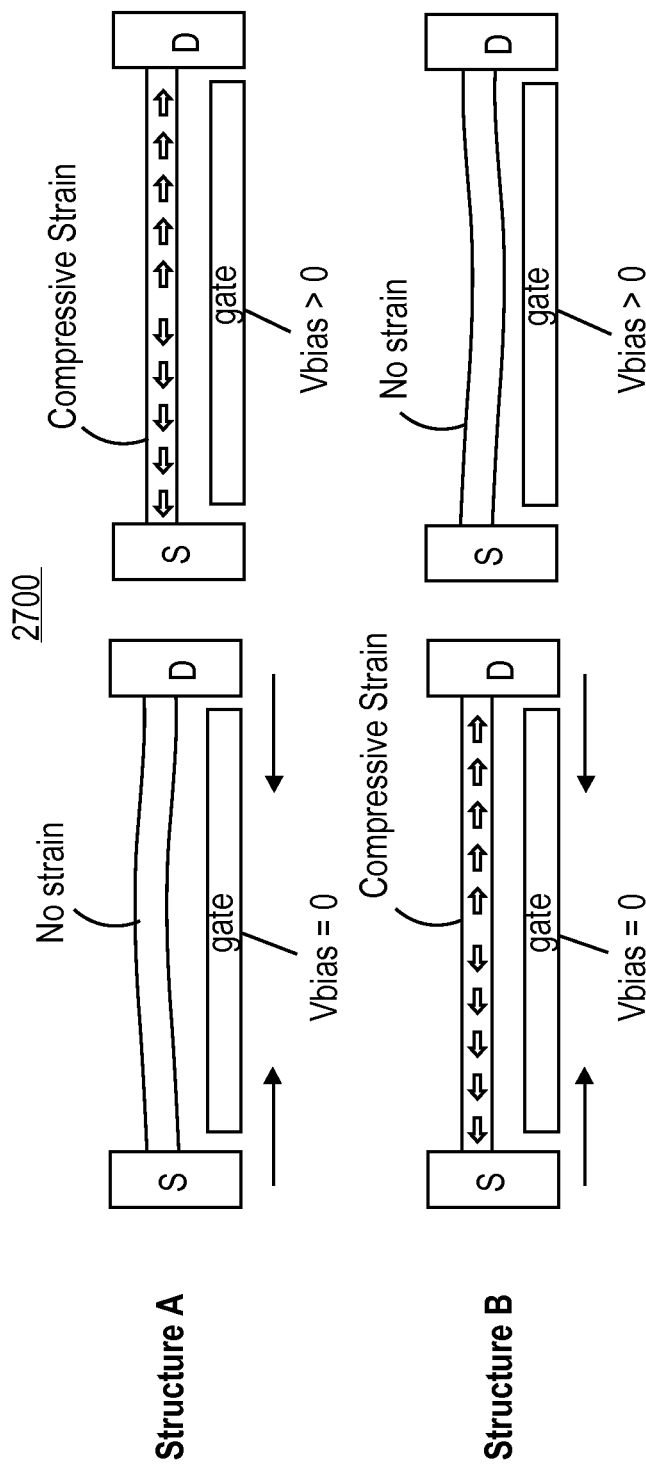
FIG. 27 is a schematic illustrating situations where (Structure A) source/drain electrodes are brought into compressive strain, the beam will "buckle" to relieve the strain, and when voltage is applied, the beam straightens and exhibits compressive strain, and where (Structure B) source/drain electrodes are brought into compressive strain (but not enough stress to buckle), and when voltage is applied, the beam straightens and exhibits the strain across the channel is reduced, in accordance with an embodiment of the present invention.

FIG. 27 is a schematic 2700 illustrating situations where (Structure A) source/drain electrodes are brought into compressive strain, the beam will "buckle" to relieve the strain, and when voltage is applied, the beam straightens and exhibits compressive strain, and where (Structure B) source/drain electrodes are brought into compressive strain (but not enough stress to buckle), and when voltage is applied, the beam straightens and exhibits the strain across the channel is reduced, in accordance with an embodiment of the present invention.

For maximum signal transduction, the beam can be pre-strained. As shown for Structure A, the source and drain electrodes are placed in compressive strain such that the structure buckles to relieve the strain. As voltage is applied through the gate electrode, the beam straightens and the entire beam is then placed in compressive stress. Structure B shows a similar concept, where the beam is stressed such that the beam doesn't buckle, but exhibits compressive stress. In an embodiment, the application of a voltage between the gate electrode and beam reduces the compressive stress and modulates the current through the structure. It is to be understood that the pre-strained or non-strained positions may still have some strain, just not a substantial amount of strain. For example, the beam may have some non-zero minimal strain which is tensile or compressive, but the overall strain energy is smaller than if it was in a "linear" configuration (since it is buckled).

Figure 28:
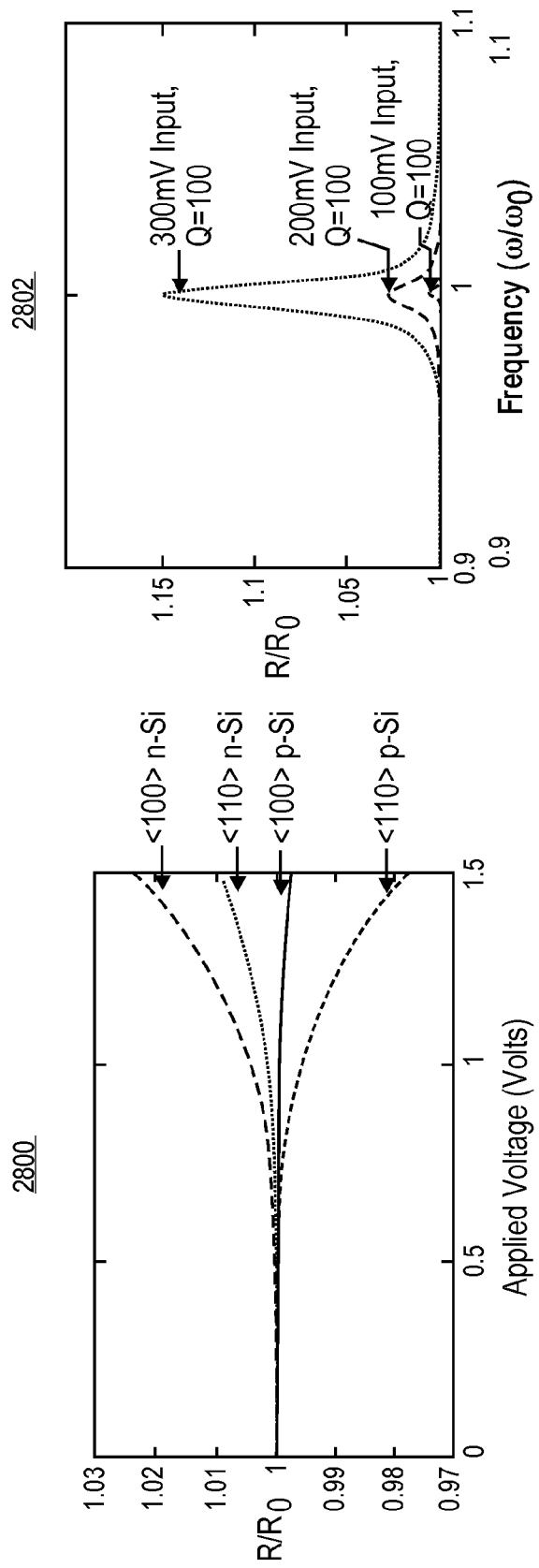
FIG. 28 includes a plot demonstrating change in resistance as a function of applied DC voltage of a 10 nm wide, and 5 nm thick silicon nanorelay for different doping and crystal orientations, and a plot demonstrating change in resistance as a function of frequency, around the mechanical resonant frequency of the nanorelay, in accordance with an embodiment of the present invention.

FIG. 28 includes a plot 2800 demonstrating change in resistance as a function of applied DC voltage of a 10 nm wide, and 5 nm thick silicon nanorelay for different doping and crystal orientations, and a plot 2802 demonstrating change in resistance as a function of frequency, around the mechanical resonant frequency of the nanorelay, in accordance with an embodiment of the present invention.

Referring to FIG. 28, simulation results plotting resistance change as a function of applied voltage are shown for a 200 nm length, 10 nm wide, and 5 nm thick silicon nanorelay following the geometry in Structure B from FIG. 27. An application of a DC voltage may increase or decrease sensed resistance depending on crystal orientation and doping profiles. As the structure is excited near the mechanical resonant frequency, the response improves. As the signal is nonlinear, it may be possible to bias the relay with a large DC signal and then apply a small AC signal around the bias point to improve linearlity.

In an embodiment, nanowires described herein may be sized as wires or ribbons, and may have squared-off or rounder corners. In an embodiment, the nanowires are composed of a material such as, but not limited to, silicon, germanium, or a combination thereof, or of a group III-V material. In one such embodiment, the nanowires are single-crystalline. For example, for a silicon nanowire, a single-crystalline nanowire may be based from a (100) global silicon orientation, e.g., with a <100> plane in the z-direction. In an embodiment, the dimensions of such nanowires, from a cross-sectional perspective, are on the nano-scale. For example, in a specific embodiment, the smallest dimension of the nanowires is less than approximately 20 nanometers. Nanowires described herein may be fabricated using semiconductor processing approaches, as is well known in the art. In other embodiments, the relay is not limited to square and rounded corner but other geometries may be used such as, but not limited to, bow-tie geometries, triangles, trapezoids or hexagons, etc.

The terms "micro-electromechanical system" (MEMS) and "nano-electromechanical system" generally refer to an apparatus incorporating some mechanical structure having a dimensional scale that is comparable to microelectronic or nanoelectronic devices, respectively. The mechanical structure is typically capable of some form of mechanical motion. Thus, MEMS and nano-electromechanical system structures contemplated herein are, in an embodiment, any device that falls within the scope of MEMS or nano-electromechanical system technologies. For example, a MEMS or nano-electromechanical system structure may be any mechanical and electronic structure fabricated using lithography, deposition, and etching processes above a substrate. In accordance with an embodiment of the present invention, the MEMS or nano-electromechanical system structure is a device such as, but not limited to, a resonator, a sensor, a detector, a filter or a mirror. In one embodiment, the MEMS or nano-electromechanical system structure is a resonator. In a specific embodiment, the resonator is one such as, but not limited to, a beam, a plate and a tuning fork or a cantilever arm.

FIG. 29 illustrates a computing device 2900 in accordance with one embodiment of the invention. The computing device 2900 houses a board 2902. The board 2902 may include a number of components, including but not limited to a processor 2904 and at least one communication chip 2906. The processor 2904 is physically and electrically coupled to the board 2902. In some implementations the at least one communication chip 2906 is also physically and electrically coupled to the board 2902. In further implementations, the communication chip 2906 is part of the processor 2904.

Depending on its applications, computing device 2900 may include other components that may or may not be physically and electrically coupled to the board 2902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 2906 enables wireless communications for the transfer of data to and from the computing device 2900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 2900 may include a plurality of communication chips 2906. For instance, a first communication chip 2906 may be dedicated to shorter range wireless communications such as Wi-Fi and Bluetooth and a second communication chip 2906 may be dedicated to longer range wireless communications such as GPS, EDGE, GPRS, CDMA, WiMAX, LTE, Ev-DO, and others.

The processor 2904 of the computing device 2900 includes an integrated circuit die packaged within the processor 2904. In some implementations of the invention, the integrated circuit die of the processor includes one or more nanowire-based mechanical switching devices, built in accordance with embodiments of the present invention. The term "processor" may refer to any device or portion of a device that processes electronic data from registers and/or memory to transform that electronic data into other electronic data that may be stored in registers and/or memory.

The communication chip 2906 also includes an integrated circuit die packaged within the communication chip 2906. In accordance with another implementation of the invention, the integrated circuit die of the communication chip includes one or more nanowire-based mechanical switching devices, built in accordance with embodiments of the present invention.

In further implementations, another component housed within the computing device 2900 may contain a stand-alone integrated circuit memory die that includes one or more nanowire-based mechanical switching devices, built in accordance with embodiments of the present invention.

In various implementations, the computing device 2900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2900 may be any other electronic device that processes data.

Thus, embodiments of the present invention include nanowire-based mechanical switching devices.

In an embodiment, a nanowire relay includes a nanowire disposed in a void disposed above a substrate. The nanowire has an anchored portion and a suspended portion. A first gate electrode is disposed adjacent the void, and is spaced apart from the nanowire. A first conductive region is disposed adjacent the first gate electrode and adjacent the void, and is spaced apart from the nanowire.

In one embodiment, the nanowire is a singly-anchored nanowire and the anchored portion of the nanowire includes only one end of the nanowire. The one end of the nanowire is coupled to a second conductive region disposed adjacent the first gate electrode and separated from the first conductive region by the first gate electrode.

In one embodiment, the first and second conductive regions are composed of a metal or semiconductor material.

In one embodiment, the nanowire is a doubly-anchored nanowire and the anchored portion of the nanowire includes a first end of the nanowire and a second end of the nanowire. The first end of the nanowire is coupled to a second conductive region disposed adjacent the first gate electrode and separated from the first conductive region by the first gate electrode. The second end of the nanowire is coupled to an anchor region disposed adjacent to a second gate electrode disposed adjacent the first conductive region and adjacent the void. The second gate electrode is spaced apart from the nanowire and separated from the first gate electrode by the first conductive region.

In one embodiment, the first and second conductive regions are composed of a metal or semiconductor material, and the anchor region is composed of a conductive or insulating material.

In one embodiment, the nanowire is oriented parallel with the substrate.

In one embodiment, the nanowire is oriented vertical with the substrate.

In one embodiment, the void comprises a vacuum, is filled with a gas, or is filled with a liquid.

In one embodiment, the void is hermetically sealed.

In one embodiment, the nanowire relay is included in a device such as, but not limited to, a mechanical logic switch, a basic logic switch, a mechanical logic switch with non-linear springs, a device for complimentary logic, a catch and release relay, a hybrid MOS-relay transistor with disconnecting source, a power gating relay, a non-volatile memory device, an electron tunneling relay, or a mechanical resonating oscillator.

In an embodiment, a method includes switching a nanowire relay from an off position to an on position. The nanowire relay includes a nanowire having a suspended portion disposed in a void and anchored by a reference voltage electrode, a gate electrode disposed adjacent the void, and an output terminal electrode disposed adjacent the gate electrode and adjacent the void. The method involves setting a voltage (Vg) of the gate electrode such that the absolute difference between Vg and a voltage of the reference voltage electrode (Vref) is greater than a threshold voltage. An electrostatic force is induced between the nanowire and the gate electrode to move the suspended portion of the nanowire toward the gate electrode and the output terminal electrode. The suspended portion of the nanowire is contacted to the output terminal electrode to create an electrical path between the output terminal electrode and the reference voltage electrode.

In one embodiment, contacting the suspended portion of the nanowire to the output terminal electrode to create the electrical path between the output terminal electrode and the reference voltage electrode causes the voltage (Vout) of the output terminal electrode to become Vref.

In one embodiment, contacting the suspended portion of the nanowire to the output terminal electrode further involves contacting the suspended portion of the nanowire to the gate electrode, but no electrical path is created between the reference voltage electrode and the gate electrode.

In one embodiment, contacting the suspended portion of the nanowire to the output terminal electrode involves contacting a non-anchored end of the nanowire to the output terminal electrode.

In one embodiment, contacting the non-anchored end of the nanowire to the output terminal electrode involves restricting motion of the nanowire by a mechanical stop at a portion of the nanowire between the non-anchored end and an anchored end of the nanowire. This can be generalized to be a non-linear spring, which can be done utilizing mechanical stops, nonlinear materials, or geometry changes (such as doubly clamped beams).

In one embodiment, a location of the portion of the nanowire between the non-anchored end and the anchored end of the nanowire is selected to maximize a spring restoring force of the nanowire.

In one embodiment, contacting the suspended portion of the nanowire to the output terminal electrode involves contacting a portion of the nanowire between a non-anchored end and an anchored end of the nanowire.

In one embodiment, a location of the portion of the nanowire between the non-anchored end and the anchored end of the nanowire is selected to maximize a spring restoring force of the nanowire.

In an embodiment, a method includes switching a nanowire relay from an on position to an off position. The nanowire relay includes a nanowire having a suspended portion disposed in a void and anchored by a reference voltage electrode, a gate electrode disposed adjacent the void, and an output terminal electrode disposed adjacent the gate electrode and adjacent the void. The method involves setting a voltage (Vg) of the gate electrode such that the absolute difference between Vg and a voltage of the reference voltage electrode (Vref) is less than a threshold voltage. An electrostatic force is reduced between the nanowire and the gate electrode to move the suspended portion of the nanowire away from the gate electrode and the output terminal electrode. The suspended portion of the nanowire is disconnected from the output terminal electrode.

In one embodiment, disconnecting the suspended portion of the nanowire from the output terminal electrode further involves disconnecting the suspended portion of the nanowire from the gate electrode.

In one embodiment, disconnecting the suspended portion of the nanowire from the output terminal electrode involves maintaining contact between the suspended portion of the nanowire and the gate electrode, but no electrical path is created between the reference voltage electrode and the gate electrode.

In one embodiment, maintaining contact between the suspended portion of the nanowire and the gate electrode in the off position provides a collapsed mode having a lower switching time relative to an off position where the suspended portion of the nanowire is disconnected from the gate electrode.

In an embodiment, a semiconductor device includes a nanowire having a suspended portion disposed between a source regions and a drain region. A gate electrode is disposed between the source and drain electrodes and proximate to, but spaced apart from, the suspended region of the nanowire.

In one embodiment, the suspended portion of the nanowire is not strained when in a non-linear geometry between the source and drain regions.

In one embodiment, the suspended portion of the nanowire is compressively strained when in a linear geometry between the source and drain regions.

What is claimed is:

1. A nanowire relay, comprising:
    a nanowire disposed in a void disposed above a substrate, the nanowire having an anchored portion and a suspended portion, wherein the nanowire comprises a semiconductor material and an insulator material disposed on the semiconductor material;
    a first gate electrode disposed adjacent the void, and spaced apart from the nanowire, wherein the insulator material of the nanowire is for preventing shorting between the gate electrode and the semiconductor material of the nanowire, and wherein the gate electrode is free from a permanent gate dielectric layer; and
    a first conductive region disposed adjacent the first gate electrode and adjacent the void, and spaced apart from the nanowire.

2. The nanowire relay of claim 1, wherein the nanowire is a singly-anchored nanowire and the anchored portion of the nanowire comprises only one end of the nanowire, and wherein the one end of the nanowire is coupled to a second conductive region disposed adjacent the first gate electrode and separated from the first conductive region by the first gate electrode.

3. The nanowire relay of claim 2, wherein the first and second conductive regions comprise a metal or semiconductor material.

4. The nanowire relay of claim 1, wherein the nanowire is a doubly-anchored nanowire and the anchored portion of the nanowire comprises a first end of the nanowire and a second end of the nanowire, wherein the first end of the nanowire is coupled to a second conductive region disposed adjacent the first gate electrode and separated from the first conductive region by the first gate electrode, and wherein the second end of the nanowire is coupled to an anchor region disposed adjacent to a second gate electrode disposed adjacent the first conductive region and adjacent the void, the second gate electrode spaced apart from the nanowire and separated from the first gate electrode by the first conductive region.

5. The nanowire relay of claim 4, wherein the first and second conductive regions comprise a metal or semiconductor material, and wherein the anchor region comprises a conductive or insulating material.

6. The nanowire relay of claim 1, wherein the nanowire is oriented parallel with the substrate.

7. The nanowire relay of claim 1, wherein the nanowire is oriented vertical with the substrate.

8. The nanowire relay of claim 1, wherein the void comprises a vacuum, is filled with a gas, or is filled with a liquid.

9. The nanowire relay of claim 8, wherein the void is hermetically sealed.

10. The nanowire relay of claim 1, wherein the nanowire relay is included in a device selected from the group consisting of a mechanical logic switch, a basic logic switch, a mechanical logic switch with non-linear springs, a device for complimentary logic, a catch and release relay, a hybrid MOS-relay transistor with disconnecting source, a power gating relay, a non-volatile memory device, an electron tunneling relay, and a mechanical resonating oscillator.

11. A method of switching a nanowire relay from an off position to an on position, the nanowire relay comprising a nanowire having a suspended portion disposed in a void and anchored by a reference voltage electrode, a gate electrode disposed adjacent the void, and an output terminal electrode disposed adjacent the gate electrode and adjacent the void, the method comprising:
    setting a voltage (Vg) of the gate electrode such that the absolute difference between Vg and a voltage of the reference voltage electrode (Vref) is greater than a threshold voltage;
    inducing an electrostatic force between the nanowire and the gate electrode to move the suspended portion of the nanowire toward the gate electrode and the output terminal electrode, wherein the nanowire comprises a semiconductor material and an insulator material disposed on the semiconductor material, wherein the insulator material of the nanowire is for preventing shorting between the gate electrode and the semiconductor material of the nanowire, and wherein the gate electrode is free from a permanent gate dielectric layer; and
    contacting the suspended portion of the nanowire to the output terminal electrode to create an electrical path between the output terminal electrode and the reference voltage electrode.

12. The method of claim 11, wherein contacting the suspended portion of the nanowire to the output terminal electrode to create the electrical path between the output terminal electrode and the reference voltage electrode causes the voltage (Vout) of the output terminal electrode to become Vref.

13. The method of claim 11, wherein contacting the suspended portion of the nanowire to the output terminal electrode further comprises contacting the suspended portion of the nanowire to the gate electrode, but wherein no electrical path is created between the reference voltage electrode and the gate electrode.

14. The method of claim 11, wherein contacting the suspended portion of the nanowire to the output terminal electrode comprises contacting a non-anchored end of the nanowire to the output terminal electrode.

15. The method of claim 14, wherein contacting the non-anchored end of the nanowire to the output terminal electrode comprises restricting motion of the nanowire by a mechanical stop at a portion of the nanowire between the non-anchored end and an anchored end of the nanowire.

16. The method of claim 15, wherein a location of the portion of the nanowire between the non-anchored end and the anchored end of the nanowire is selected to maximize a spring restoring force of the nanowire.

17. The method of claim 11, wherein contacting the suspended portion of the nanowire to the output terminal electrode comprises contacting a portion of the nanowire between a non-anchored end and an anchored end of the nanowire.

18. The method of claim 17, wherein a location of the portion of the nanowire between the non-anchored end and the anchored end of the nanowire is selected to maximize a spring restoring force of the nanowire.

19. A method of switching a nanowire relay from an on position to an off position, the nanowire relay comprising a nanowire having a suspended portion disposed in a void and anchored by a reference voltage electrode, a gate electrode disposed adjacent the void, and an output terminal electrode disposed adjacent the gate electrode and adjacent the void, the method comprising:
    setting a voltage (Vg) of the gate electrode such that the absolute difference between Vg and a voltage of the reference voltage electrode (Vref) is less than a threshold voltage;
    reducing an electrostatic force between the nanowire and the gate electrode to move the suspended portion of the nanowire away from the gate electrode and the output terminal electrode, wherein the nanowire comprises a semiconductor material and an insulator material disposed on the semiconductor material, wherein the insulator material of the nanowire is for preventing shorting between the gate electrode and the semiconductor material of the nanowire, and wherein the gate electrode is free from a permanent gate dielectric layer; and
    disconnecting the suspended portion of the nanowire from the output terminal electrode.

20. The method of claim 19, wherein disconnecting the suspended portion of the nanowire from the output terminal electrode further comprises disconnecting the suspended portion of the nanowire from the gate electrode.

21. The method of claim 19, wherein disconnecting the suspended portion of the nanowire from the output terminal electrode comprises maintaining contact between the suspended portion of the nanowire and the gate electrode, but wherein no electrical path is created between the reference voltage electrode and the gate electrode.

22. The method of claim 21, wherein maintaining contact between the suspended portion of the nanowire and the gate electrode in the off position provides a collapsed mode having a lower switching time relative to an off position comprising the suspended portion of the nanowire disconnected from the gate electrode.

23. A semiconductor device, comprising:
    a semiconductor nanowire having a suspended portion disposed between a source electrode and a drain electrode; and
    a gate electrode disposed between the source and drain electrodes and proximate to, but spaced apart from, the suspended region of the semiconductor nanowire, wherein the suspended portion of the semiconductor nanowire is not substantially strained when in a non-linear geometry between the source and drain electrodes, wherein the semiconductor nanowire is anchored to both the source electrode and the drain electrode.

24. A semiconductor device, comprising:
    a semiconductor nanowire having a suspended portion disposed between a source electrode and a drain electrode; and
    a gate electrode disposed between the source and drain electrodes and proximate to, but spaced apart from, the suspended region of the nanowire, wherein the suspended portion of the semiconductor nanowire is compressively strained when in a linear geometry between the source and drain electrodes, and wherein the semiconductor nanowire is anchored to both the source electrode and the drain electrode.

* * * * *